United States Patent
Zhang et al.

(10) Patent No.: US 11,657,883 B2
(45) Date of Patent: May 23, 2023

(54) ISOLATING PROBLEMATIC MEMORY PLANES TO AVOID NEIGHBOR PLAN DISTURB

(71) Applicant: Western Digital Technologies, Inc., San Jose, CA (US)

(72) Inventors: Ke Zhang, Shanghai (CN); Liang Li, Shanghai (CN); Jiahui Yuan, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 6 days.

(21) Appl. No.: 17/382,424

(22) Filed: Jul. 22, 2021

(65) Prior Publication Data

US 2023/0023618 A1  Jan. 26, 2023

(51) Int. Cl.
*G11C 16/34* (2006.01)
*G11C 16/08* (2006.01)
(Continued)

(52) U.S. Cl.
CPC ....... *G11C 16/3445* (2013.01); *G11C 16/08* (2013.01); *G11C 16/102* (2013.01); *G11C 16/26* (2013.01); *G11C 16/3459* (2013.01)

(58) Field of Classification Search
CPC ....... G11C 16/08; G11C 16/102; G11C 16/26; G11C 16/3459; G11C 16/02; G11C 16/04;
(Continued)

(56) References Cited

U.S. PATENT DOCUMENTS 9,026,757 B2 * 5/2015 Li ............... G11C 16/3459
  711/163
9,081,664 B2 * 7/2015 Tanimoto ........... G06F 12/0246
(Continued)

FOREIGN PATENT DOCUMENTS

CN  106205709 A  12/2016
CN  111356980 A  6/2020
CN  114631148 A  6/2022

OTHER PUBLICATIONS

U.S. Appl. No. 17/360,184, filed Jun. 28, 2021.
(Continued)

*Primary Examiner* — Kretelia Graham
(74) *Attorney, Agent, or Firm* — Vierra Magen Marcus LLP

(57) ABSTRACT

Apparatuses and techniques are described for detecting and isolating defective blocks of memory cells in a multi-plane operation such as program or erase. In one aspect, a program operation begins in a multi-plane mode, for one block in each plane. If fewer than all blocks complete programming by the time a trigger number of program loops have been performed, one or more unpassed blocks are programmed further, one at a time, in a single plane mode. If the one or more unpassed blocks do not complete programming when a maximum allowable number of program loops have been performed, they are marked as bad blocks and disabled from further operations. In another aspect, when a trigger number of program loops have been performed, one or more unpassed blocks are subject to a word line leakage detection operation.

19 Claims, 28 Drawing Sheets

(51) Int. Cl.
*G11C 16/26* (2006.01)
*G11C 16/10* (2006.01)

(58) Field of Classification Search
CPC ............ G11C 16/0408; G11C 16/0433; G11C 16/0483; G11C 16/06; G11C 16/10; G11C 16/12; G11C 16/24; G11C 16/34; G11C 16/3418; G11C 16/3422; G11C 16/3427; G11C 16/3436; G11C 16/3454; G11C 16/3463; G11C 16/3481; G11C 16/3846; G11C 16/3495
See application file for complete search history.

(56) References Cited

U.S. PATENT DOCUMENTS

| | | | |
|---|---|---|---|
| 9,195,584 B2 | 11/2015 | Manohar et al. | |
| 9,595,343 B1* | 3/2017 | Srinivasan | ............. G11C 16/10 |
| 10,248,515 B2* | 4/2019 | Srinivasan | .......... G06F 11/2094 |
| 10,529,435 B2 | 1/2020 | Puthenthermadam et al. | |
| 11,037,635 B1 | 6/2021 | Lien et al. | |
| 2006/0126390 A1 | 6/2006 | Gorobets et al. | |
| 2012/0008384 A1 | 1/2012 | Li et al. | |
| 2012/0033494 A1 | 2/2012 | Hemink | |
| 2017/0123994 A1 | 5/2017 | Pandya et al. | |
| 2019/0006019 A1 | 1/2019 | Wang et al. | |
| 2019/0348127 A1 | 11/2019 | Chin et al. | |
| 2021/0383880 A1 | 12/2021 | Chava et al. | |
| 2022/0122667 A1* | 4/2022 | Lee | .................... G11C 16/0483 |

OTHER PUBLICATIONS

International Search Report & The Written Opinion of the International Searching Authority dated Dec. 1, 2022, International Application No. PCT/US2022/027357.

English Abstract of CN Publication No. 11356980 published Jun. 30, 2022.

English Abstract of CN Publication No. 106205709 published Dec. 7, 2016.

English Abstract of CN Publication No. 114631148 published Jun. 14, 2022.

* cited by examiner

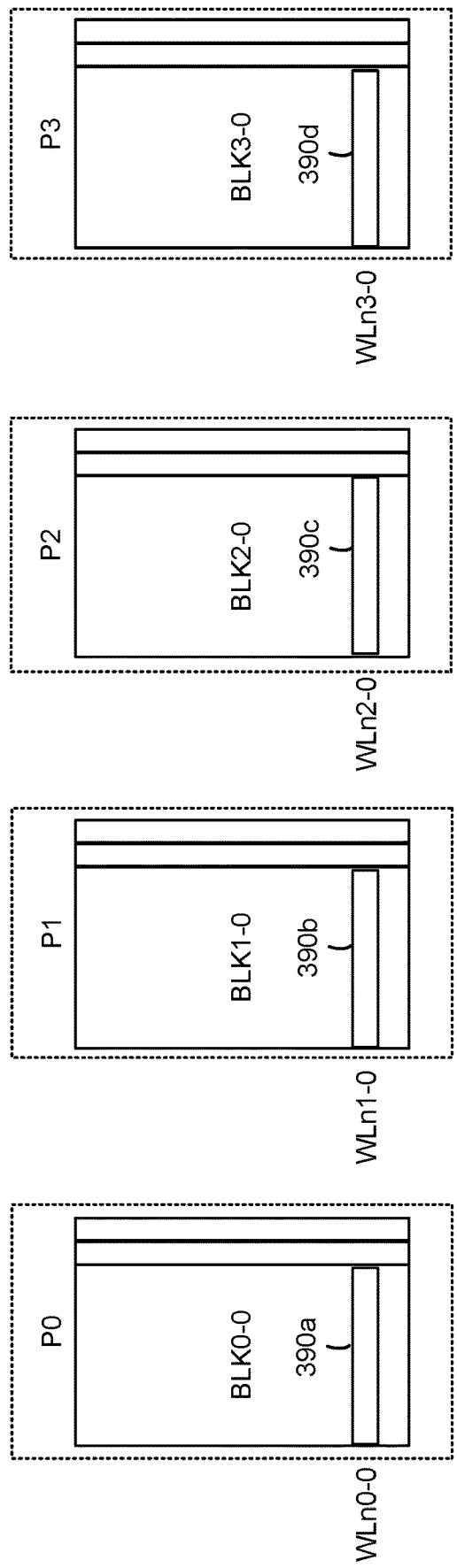

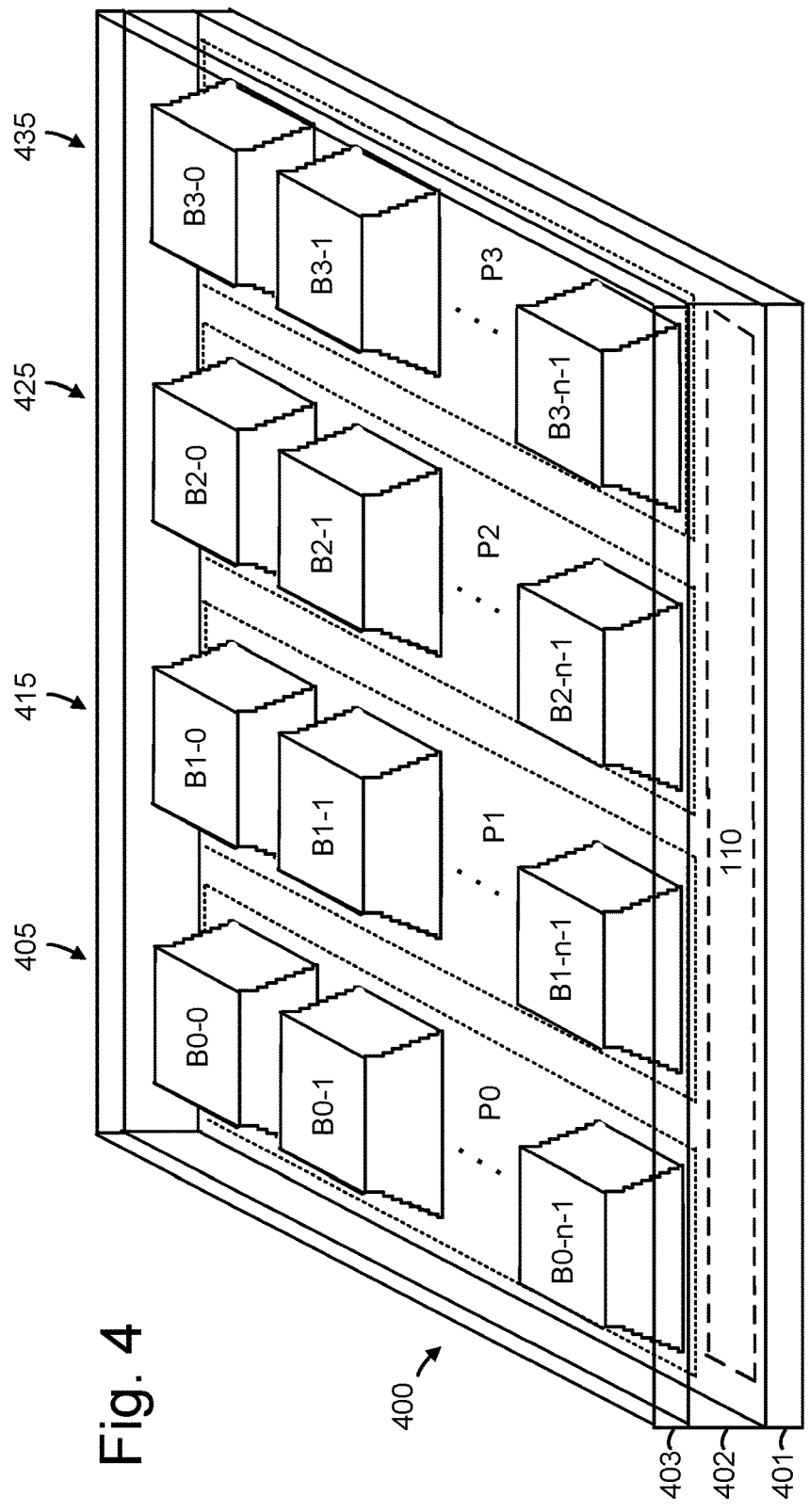
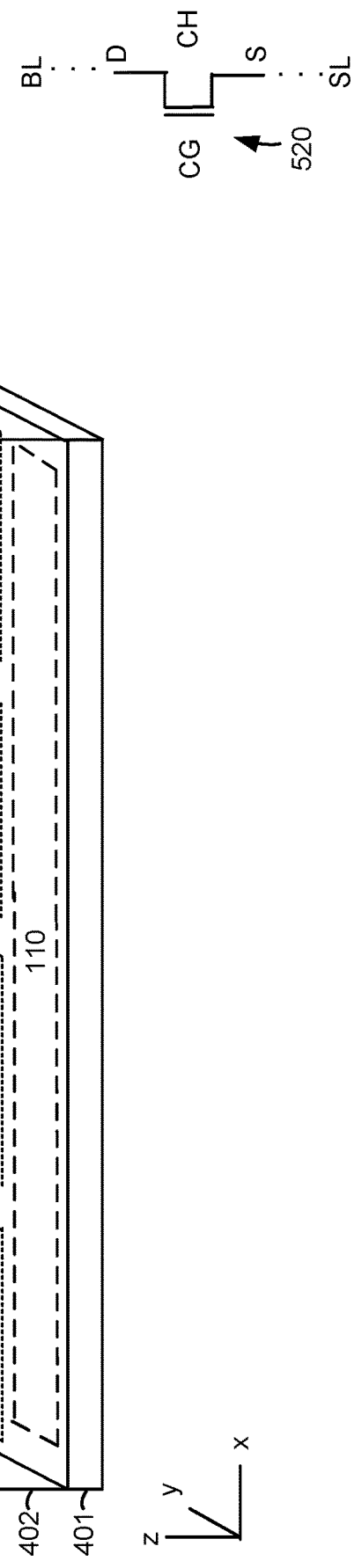

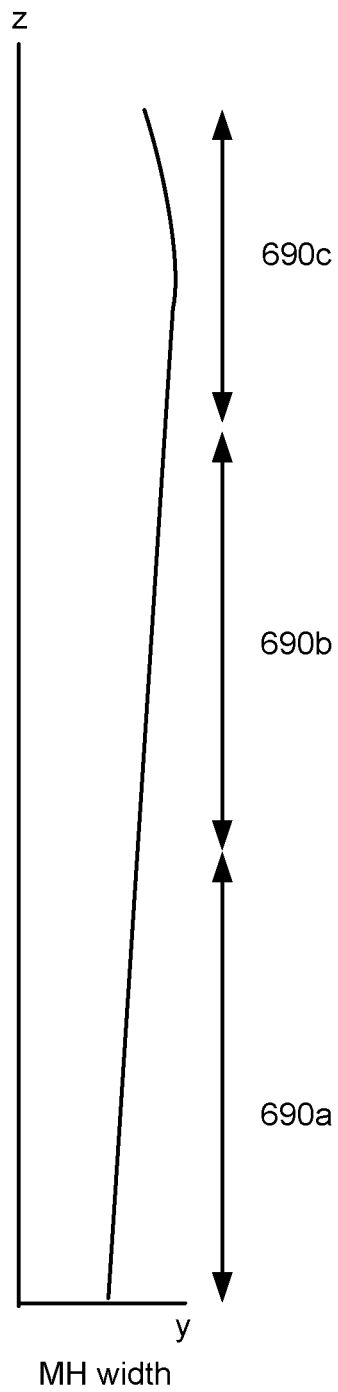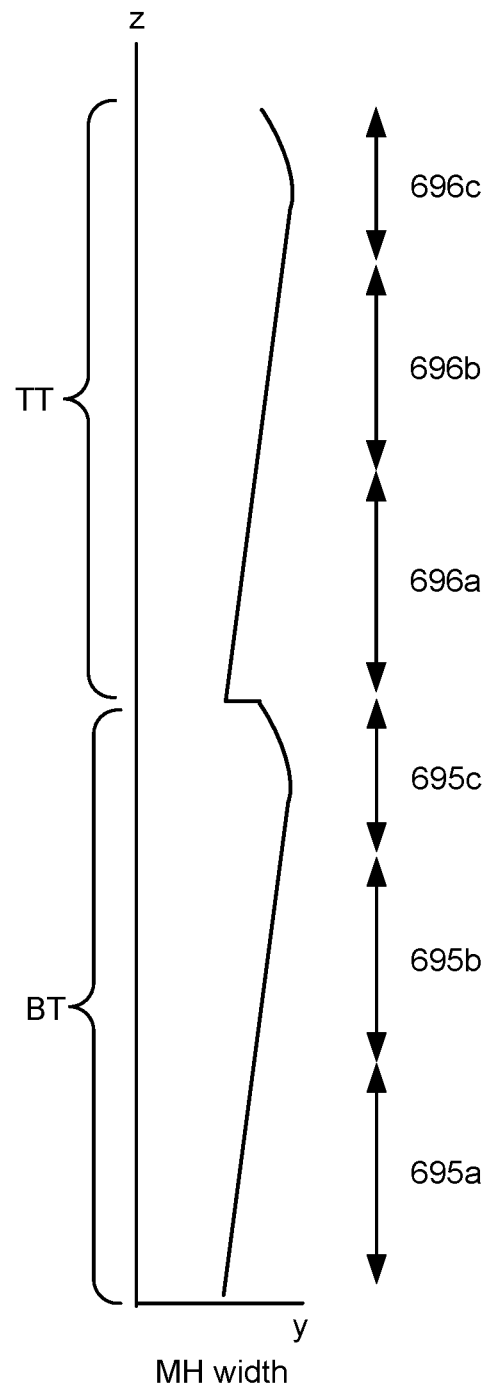

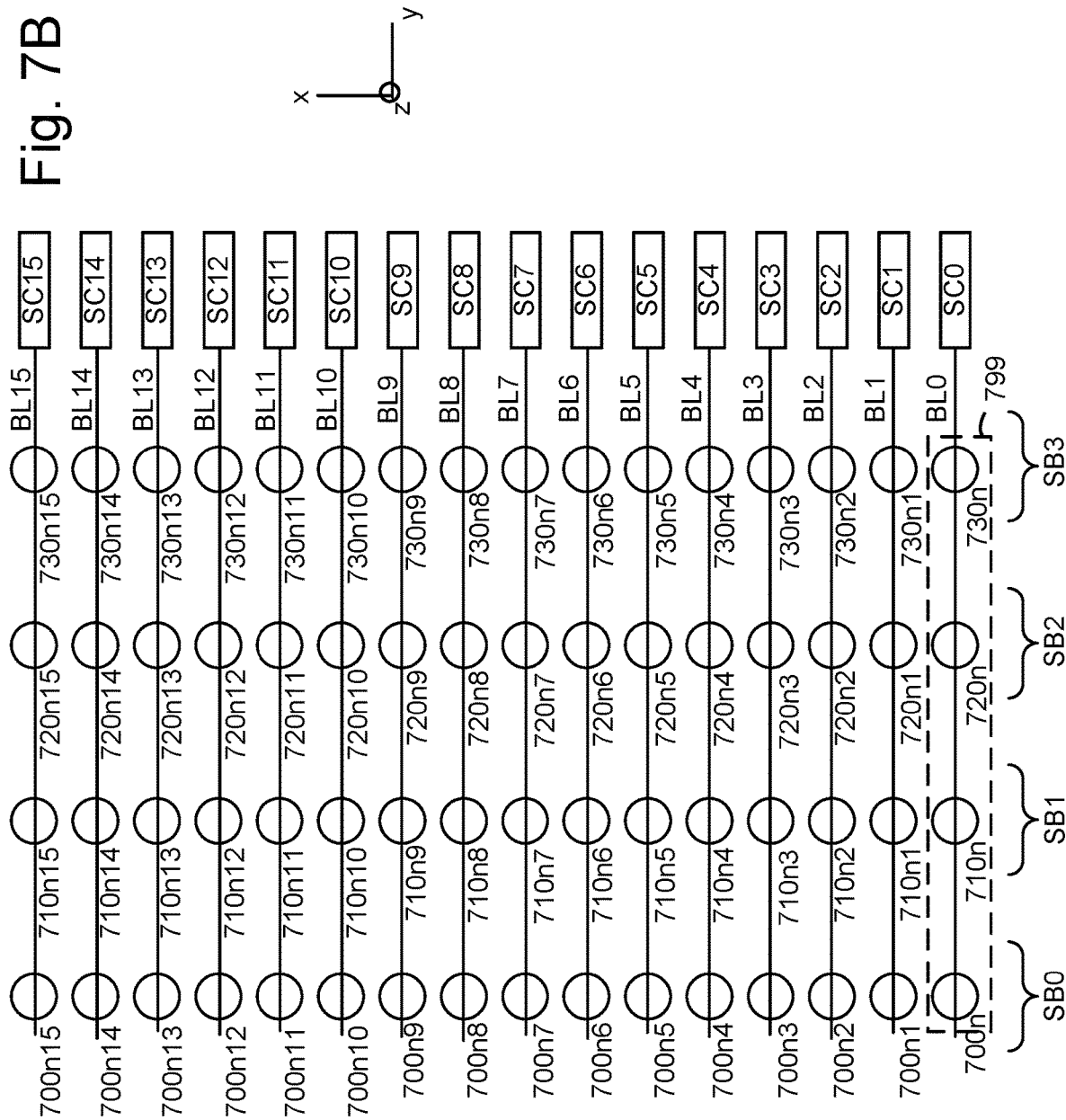

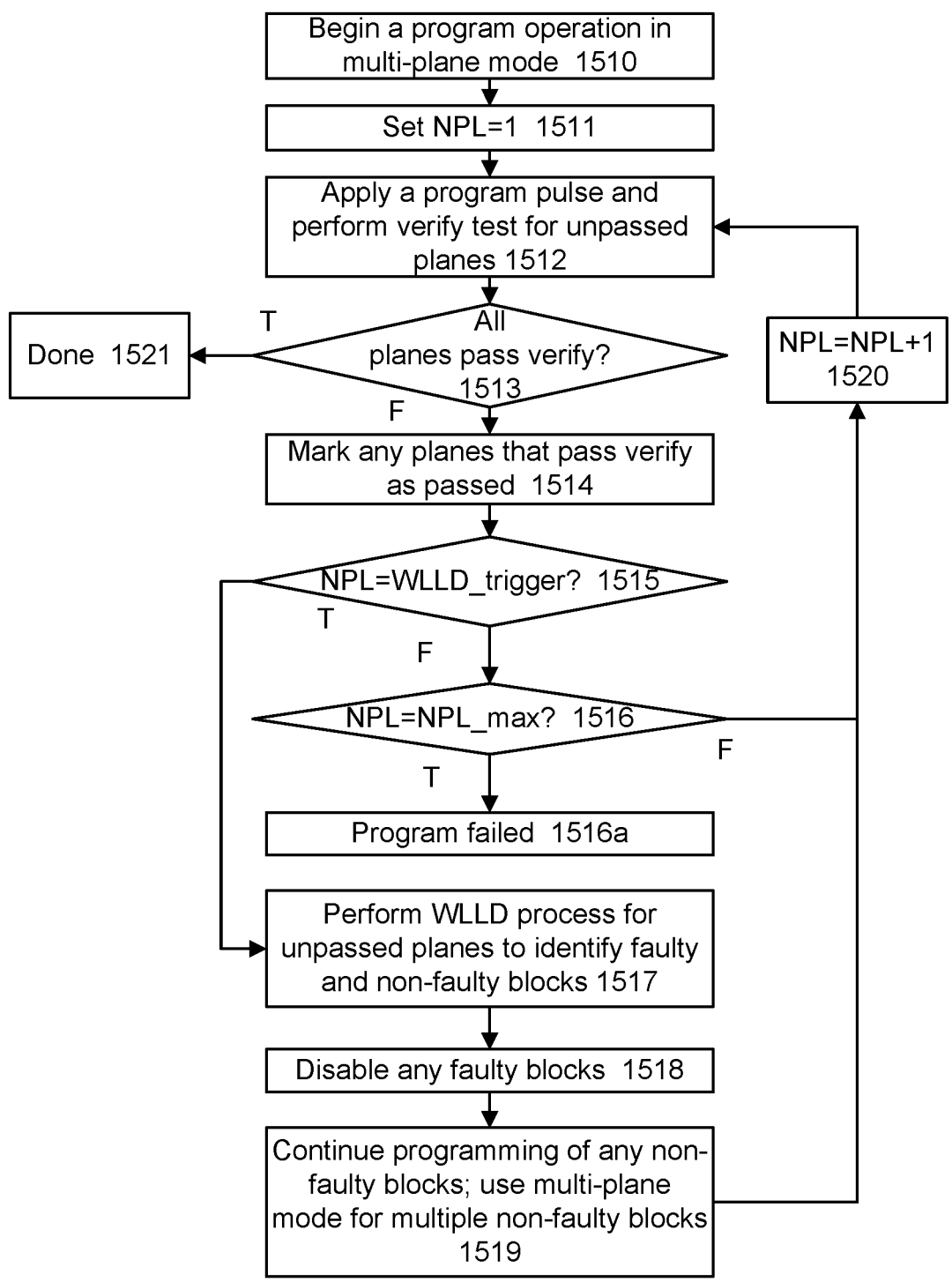

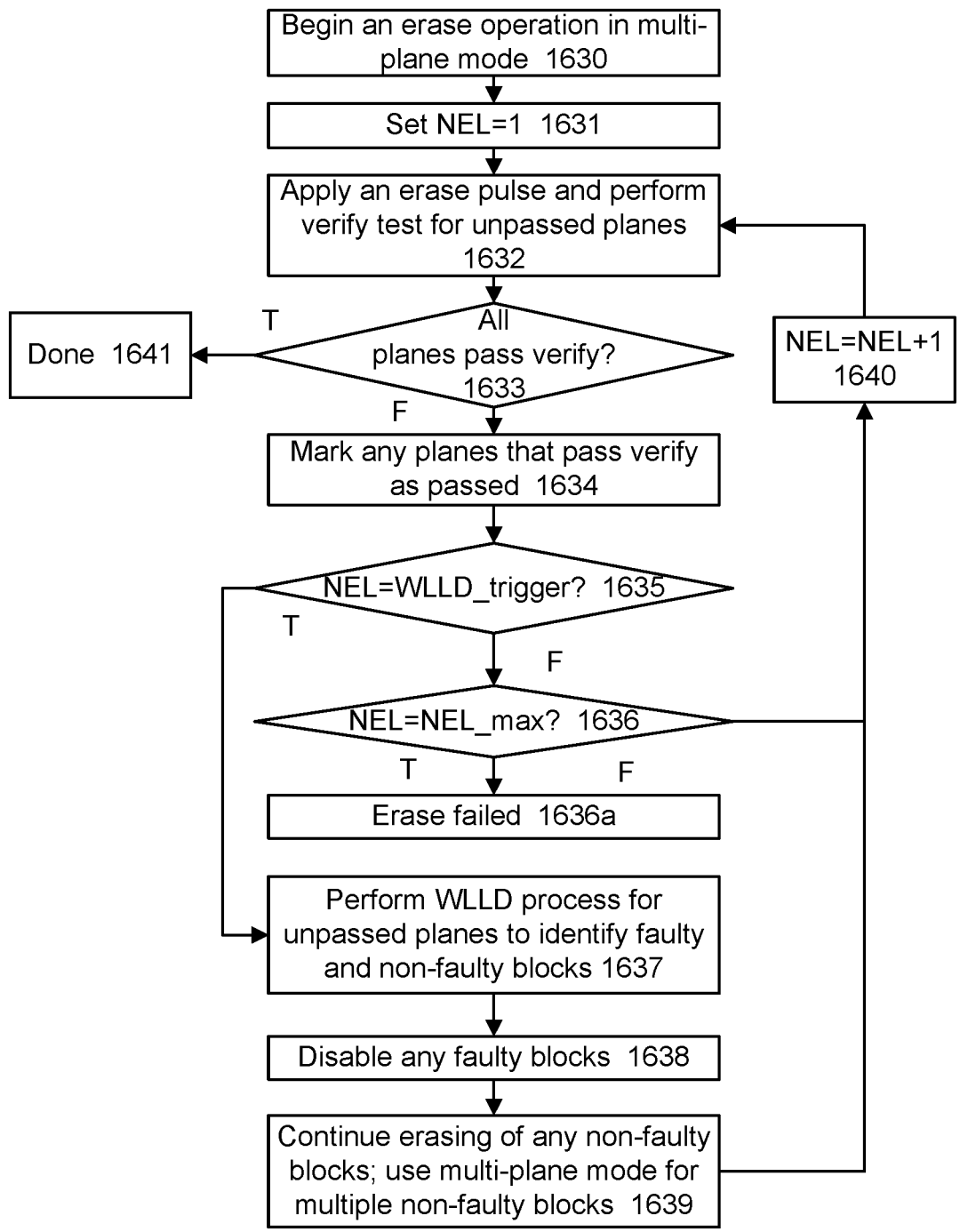

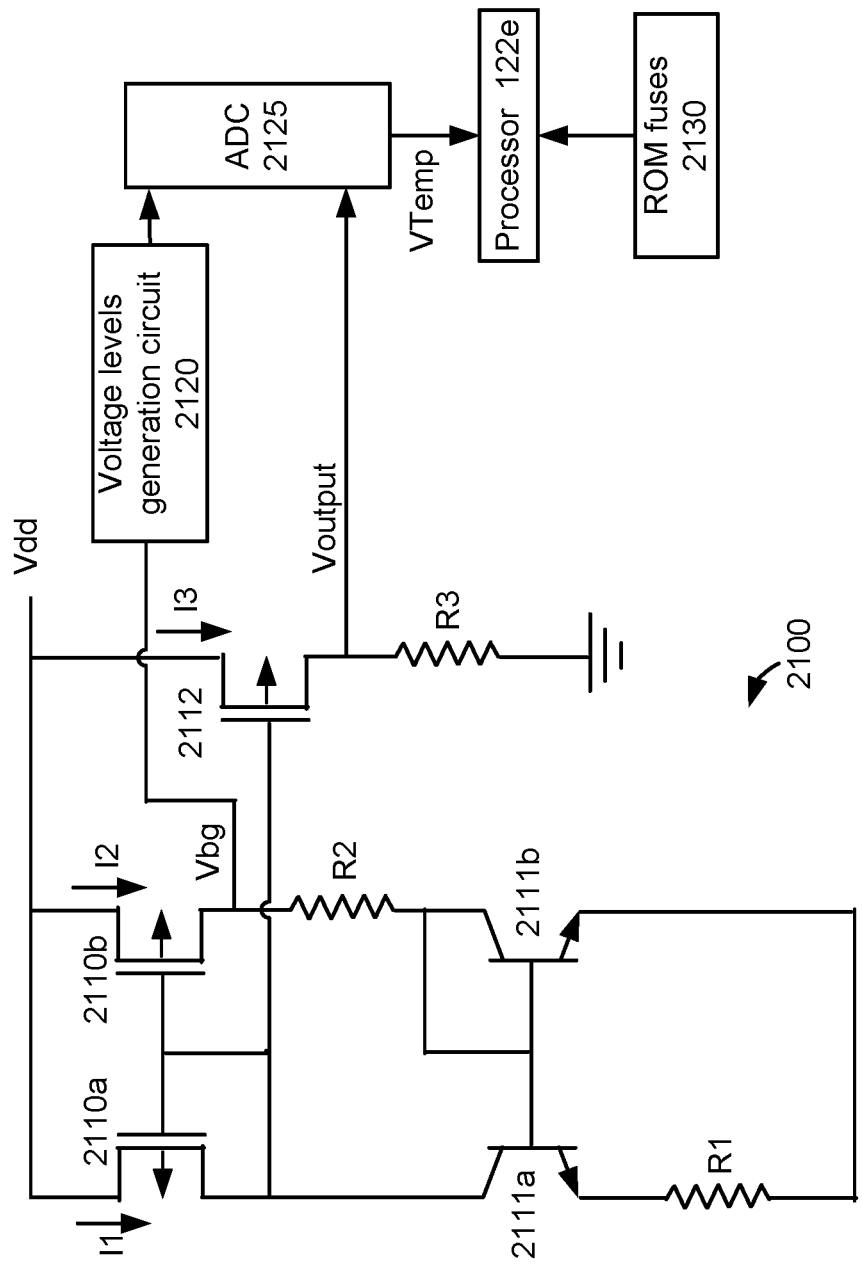

ISOLATING PROBLEMATIC MEMORY PLANES TO AVOID NEIGHBOR PLAN DISTURB

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 3C is a block diagram depicting a respective set of memory cells connected to a selected word line in a selected block of each of the planes P0-P3 of FIG. 3A.

FIG. 4 is a perspective view of an example memory die 400 consistent with FIG. 1A, where blocks of memory cells are provided in respective planes P0-P3.

FIG. 5 depicts an example transistor 520 in the memory structure 126 of FIG. 1A.

FIG. 6C depicts an example plot of memory hole width versus height in the NAND string 700n of FIG. 6A.

FIG. 6D depicts an example plot of memory hole width versus height in the NAND string 700na of FIG. 6B.

FIG. 7B depicts an example top view of the block BLK0-0 of FIG. 7A, with respective NAND strings, bit lines and sense circuits.

FIG. 15B depicts a flowchart of a program operation consistent with FIG. 15A, where a trigger (WLLD_trigger) for performing the word line leakage detection operation is predetermined.

FIG. 16C depicts a flowchart of an erase operation, where a trigger (WLLD_trigger) for performing a block leakage detection operation is predetermined.

FIG. 21 depicts an example of a temperature-sensing circuit for use in connection with FIG. 18.

DETAILED DESCRIPTION

Figure 1A:
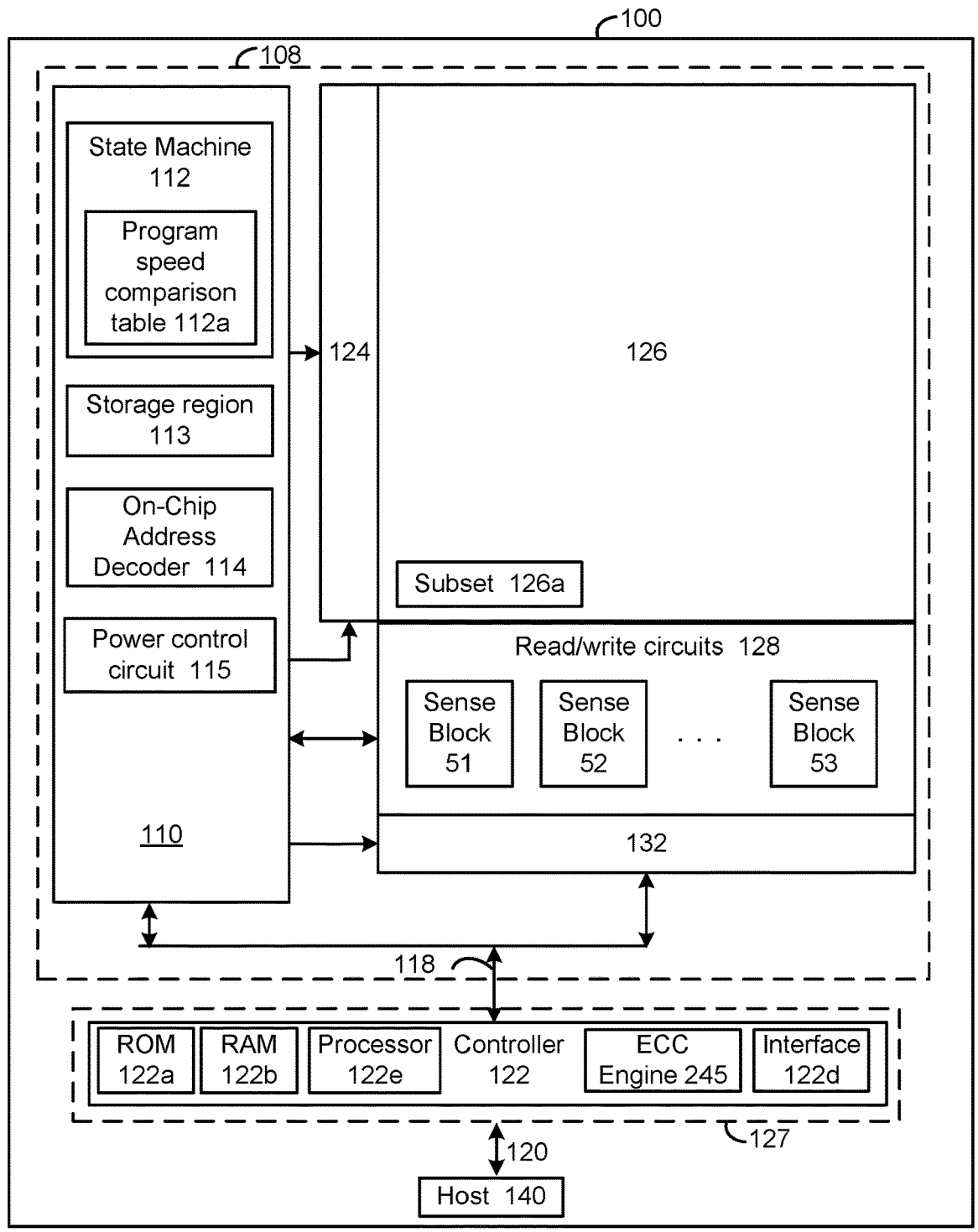
FIG. 1A is a block diagram of an example memory device.

Apparatuses and techniques are described for detecting and isolating defective blocks of memory cells in a multi-plane operation.

In some memory devices, memory cells are joined to one another such as in NAND strings in a block or sub-block. Each NAND string comprises memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The memory cells can include data memory cells, which are eligible to store user data, and dummy memory cells, which are ineligible to store user data. Dummy memory cells are used to reduce disturbs of data memory cells by providing buffer regions along the NAND string.

Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string is formed in a memory hole in the stack and may have the shape of a pillar which intersects with the word lines to form the memory cells. Further, each NAND string includes various layers which extends vertically in the stack. A source end of the NAND string is connected to the substrate and a drain end of the NAND string is connected to a bit line.

In particular, 3D NAND flash memory is widely used for storage in consumer devices, enterprise systems and industrial applications because of its non-volatility, affordability, high storage density and high access speed.

Data can be stored in the memory cells by programming them to different data states which are represented by different ranges of threshold voltages (Vth). Generally, one or more bits can be stored in each memory cell. The data states can include an erased state and one or more programmed data states. In single level cell (SLC) programming, each memory cell stores one bit of data in an erased or programmed state. In multi-level cell (MLC) programming, each memory cell stores multiple bits of data in an erased state or one of multiple programmed states. The SLC mode stores data more reliably and can be read more quickly. It may be used for file system data, for example. The MLC mode stores data with greater density. A block can transition between SLC and MLC modes to meet the needs of the memory device.

During programming, a series of program-verify loops or iterations (program loops) are performed for a selected word line. Each program-verify loop is performed by applying a program pulse followed by one or more verify voltages to a selected word line. During each program pulse, programming is enabled for memory cells which have not yet completed programming. For example, the programming of a memory cell in a NAND string can be enabled by setting the respective bit line voltage to 0 V. Also, during each program pulse, programming is inhibited for memory cells which have completed programming, or which are assigned to the erased state and therefore do not undergo programming. For example, the programming of a memory cell in a NAND string can be inhibited by setting the respective bit line voltage to 1-2 V.

During the applying of a verify voltage associated with a data state, the memory cells which are assigned to that data state and which have not previously completed programming are sensed in a verify test to determine whether their Vth exceeds the verify voltage. If the Vth exceeds the verify voltage, the memory cell has successfully completed programming. Typically, the program operation is successful if the programming of all the data states is completed within a maximum allowable number of program-verify loops.

After the programming is completed, a read operation can be performed to identify the data stored in the memory cells. A read operation can be performed by applying read voltages to the selected word line based on the page of data which is to be read. The read operation is successful if the data can be read without uncorrectable read errors.

Before the programming, a block of memory cells is erased. An erase operation typically has multiple erase-verify loops or iterations. Each loop has an erase portion in which an erase pulse is applied to charge up the NAND string channels, and a verify portion in which an erase-verify test is performed for the memory cells to determine whether their Vth has decreased below a verify level. The channels can be charged up by applying the erase pulse to the substrate to introduce holes into the channels from in the substrate. In another approach, the channels can be charged up by biasing the SGS and/or SGD transistors to generate holes in the channels by gate induced drain leakage (GIDL).

To address the need to reduce the program or erase time, multiple blocks can be programmed or erased concurrently in respective planes, in a multi-plane architecture. Planes represent respective isolation regions, such as p-wells, which are formed in a substrate. For example, programming or erasing can occur for one block in each plane. However, good (non-defective) blocks are prone to being disturbed by a bad (defective) block in the multi-plane architecture, as a form of neighbor plane disturb. For example, a defective block may have a short circuit or leaky path directly between word lines, between word lines via a local interconnect, or between a word line and a local interconnect. Moreover, the defects in the blocks may occur after the time of manufacture when they are harder to detect and more impact the customer. A block subject to disturb, also referred to as a victim block, can experience a shifted verify voltage, a program disturb induced error, or a pull down or up in the program, read or erase voltage. The victim block can experience a program or read failure which results in the loss of user data.

Detecting the presence of a defect is particularly challenging in SLC devices. For example, with MLC devices, it is possible to provide an early termination of the programing of a defective block, while the non-defective blocks continue programming since there are many programmed states. This approach is problematic for SLC devices because there is only one programmed state. Also, with SLC devices, the program or erase operation may only involve one, or a small number, of program or erase loops, respectively. Another approach is to perform a leakage detection process for each block before the program or erase operation starts, but this is time consuming. The single plane operation can also avoid neighbor plane disturb but does not provide the time saving benefits of multi-plane operations.

Techniques provided herein address the above and other issues. In one aspect, a program operation begins in a multi-plane mode, for one block in each plane. If fewer than all blocks complete programming by the time a trigger number of program loops have been performed, one or more non-passed blocks (blocks which do not pass a program-verify test and complete programming) are programmed further, one at a time, in a single plane mode. One or more additional program loops can be performed. If the one or more non-passed blocks do not complete programming when a maximum allowable number of program loops have been performed, they are marked as bad blocks and disabled from further operations. The maximum allowable number can include the program loops in the multi-plane and single-plane modes.

In another aspect, the program operation begins in the multi-plane mode as discussed above. When a trigger number of program loops have been performed, one or more non-passed blocks are subject to a word line leakage detection operation. If any of the one or more non-passed blocks are faulty based on the process, they are marked as bad blocks and disabled from further operations. The program operation continues with the remaining unpassed blocks in a multi-plane mode if there are multiple remaining unpassed blocks or in a single plane mode if there is a single unpassed block.

In another aspect, an erase operation begins in a multi-plane mode, for one block in each plane. If fewer than all blocks complete programming by the time a trigger number of erase loops have been performed, one or more unpassed blocks (blocks which do not pass an erase-verify test and complete erasing) are erased further, one at a time, in a single plane mode. One or more additional erase loops can be performed. If the one or more unpassed blocks do not complete erasing when a maximum allowable number of erase loops have been performed, they are marked as bad blocks and disabled from further operations.

The trigger number of loops and the maximum allowable number of loops can be predetermined, before the operation begins. In one approach, the trigger number of loops and/or the maximum allowable number of loops are a function of a temperature, a selected word line position which corresponds to a memory hole width and/or a number of program-erase cycles. In another approach, the trigger number of loops and/or the maximum allowable number of loops are determined adaptively, during the operation. For example, in a program operation, the trigger number of loops and/or the maximum allowable number of loops can be set based on the program loop in which a first block/plane completes programming. In an erase operation, the trigger number of loops and/or the maximum allowable number of loops can be set based on the erase loop in which a first block/plane completes erasing.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically, a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, including a program speed comparison table 112*a* (see examples in FIGS. 14D, 14E and 16D), an on-chip address decoder 114, and a power control circuit 115. The table 112*a* can include latches for storing data.

A storage region 113 may also be provided, e.g., for operational parameters and software/code. In one embodiment, the state machine is programmable by the software. In other embodiments, the state machine does not use software and is completely implemented in hardware (e.g., electrical circuits). The storage region 113 can be used to store optimum time periods which are determined in recovery read operations as described herein.

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. In some cases, uncorrectable read errors can occur which trigger recovery read operations as described herein. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively, or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular, and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
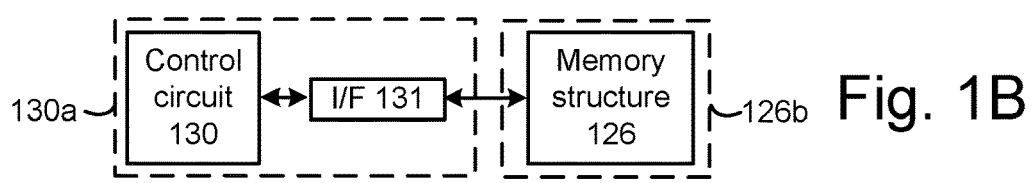
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, like the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example. For example, the control circuit can issue commands to the voltage drivers in FIG. 3 to provide the voltage signals described herein and to implement the techniques discussed herein.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

Figure 2:
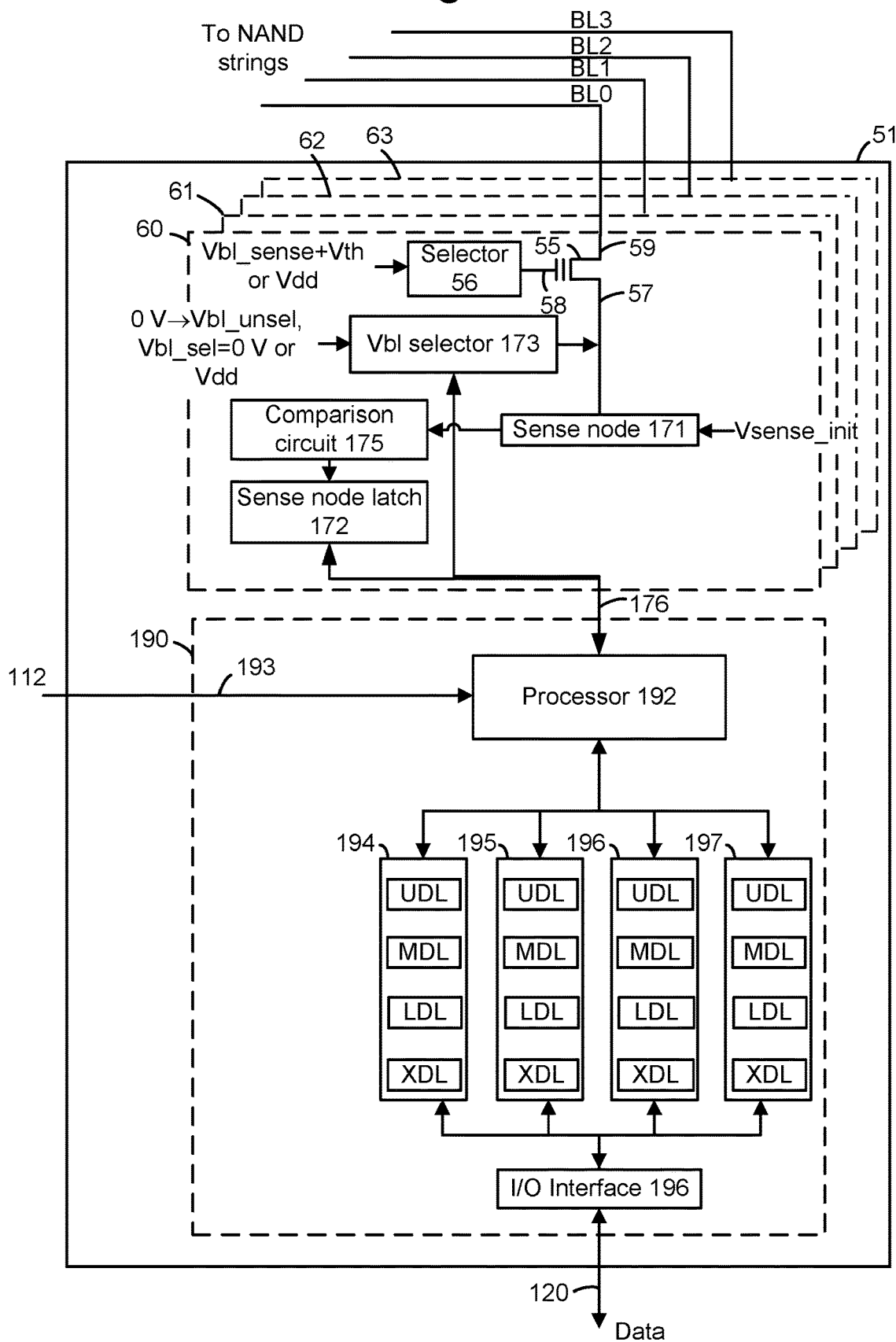
FIG. 2 is a block diagram depicting one embodiment of the sense block 51 of FIG. 1A.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIGS. 7A and 7B, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. A verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg-Vcelsrc-Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vsense+Vth, e.g., 1.5 V, to the control gate of the transistor 55 to provide Vsense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from a BL voltage driver based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits.

During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. For example, in a program-verify test, a 0 can denote fail and a 1 can denote pass. The bit in the sense node latch can be read out in a state bit scan operation of a scan operation or flipped from 0 to 1 in a fill operation.

The bit in the sense node latch can also be used in a lockout scan to decide whether to set a bit line voltage to an inhibit or program level in a next program loop. The latches 194-197 may be considered to be data state latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of four latches, e.g., comprising individual latches XDL, LDL, MDL, UDL, can be provided for each sense circuit. In some cases, a different number of data latches may be used. In a three bit per cell MLC embodiment, LDL stores a bit for a lower page of data, MDL stores a bit for a middle page of data and UDL stores a bit for an upper page of data. In a one bit per cell SLC embodiment, LDL stores a bit for the page of data. As mentioned, a block can be used in an SLC mode or MLC mode at different times. XDL is a data transfer latch which transfers data between the I/O interface 196 and the LDL, MDL and UDL latches.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two agree, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60.

In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
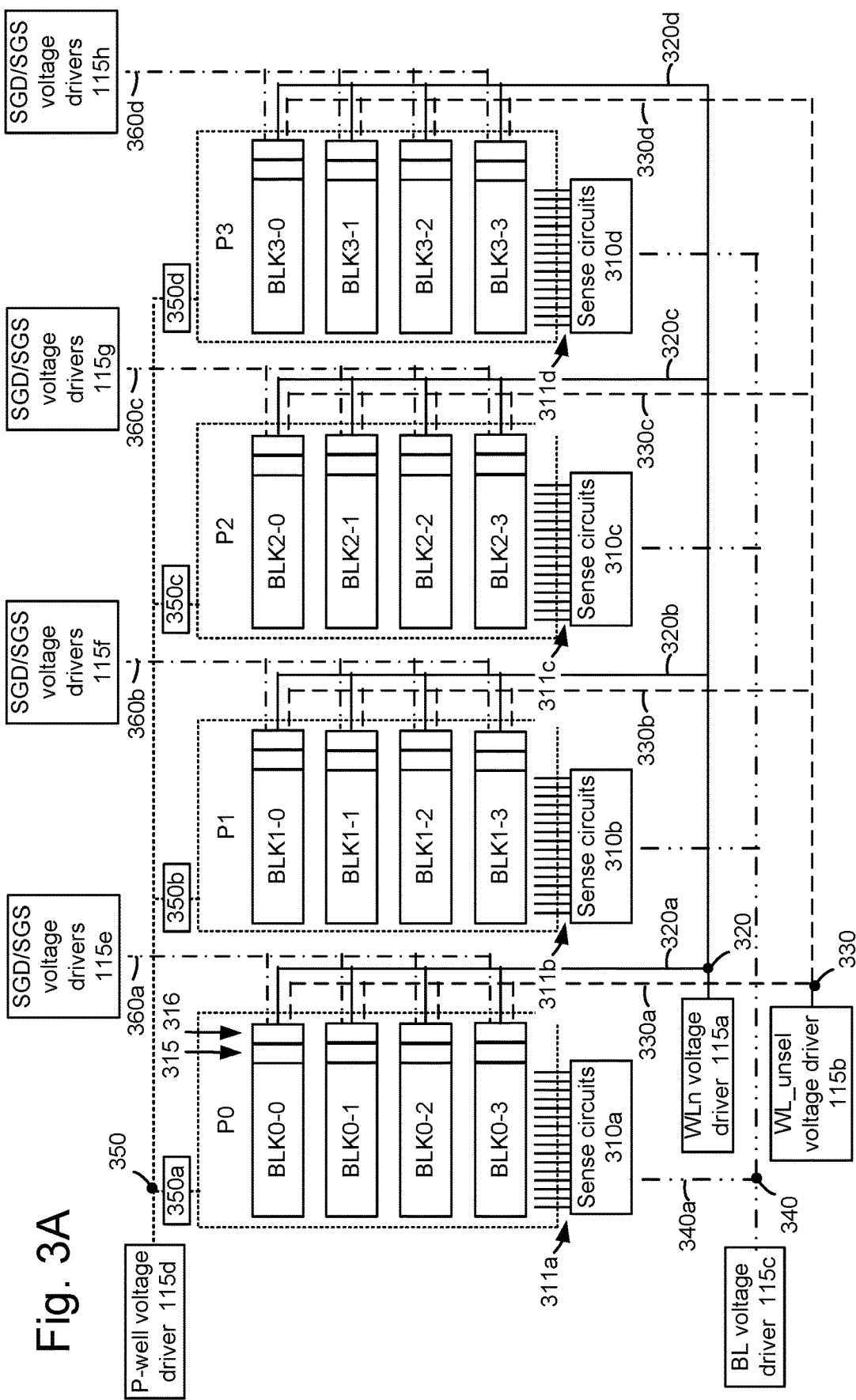
FIG. 3A is a block diagram depicting blocks of memory cells arranged in four example planes on a substrate.

FIG. 3A is a block diagram depicting blocks of memory cells arranged in four example planes on a substrate. As mentioned, planes represent respective isolation regions, such as p-wells, which are formed in a substrate. A number of blocks of memory cells which share a common set of bit lines can be formed in each plane. In this example, there are four planes, P0-P3, and four blocks per plane. P0 includes blocks BLK0-0 to BLK0-0-3. P1 includes blocks BLK1-0 to BLK1-3. P2 includes blocks BLK2-0 to BLK2-3. P3 includes blocks BLK3-0 to BLK3-3. Generally, two or more planes can be provided on a memory die. Each plane includes a set of bit lines connected to sense circuits, such as the example sets of bit lines 311a-311d connected to the sense circuits 310a-310d for P0-P3, respectively.

Each block is associated with a set of word line switches and a row decoder. For example, see the sets of word line switches 315 and set of row decoders 316 for P0. Further details are provided in FIG. 3B.

Various voltage drivers are provided as part of the power control circuit 115 of FIG. 1A. For example, a WLn voltage driver 115a provides a common voltage signal at a node 320 for a selected word line in each selected block of P0-P3 in a program operation. The voltage is provided to the blocks in P0-P3 via conductive paths 320a-320d, respectively.

A WL_unsel voltage driver 115b provides a common voltage signal at a node 330 for unselected word lines in each block. The voltage is provided to the blocks in P0-P3 via conductive paths 330a-330d, respectively.

A bit line (BL) voltage driver 115c provides a common voltage signal at a node 340. The voltage is provided to the bit lines in P0-P3 via conductive paths 340a-340d, respectively.

A p-well voltage driver 115d provides a common voltage signal at a node 350. The voltage is provided to P0-P3 via switches 350a-350d, respectively. The switches can pass or block the voltage based on respective control signals. The switches can be transistors.

SGD/SGS voltage drivers 115e-115h can be provided for P0-P3, respectively, via conductive paths 360a-360d, respectively. These voltage drivers can provide a voltage Vsgd to the SGD transistors of each sub-block of a selected block and a voltage Vsgs to the SGS transistors of each block, for example. These voltage drivers are show as being grouped for simplicity.

In a multi-plane program operation, one block in each plane is selected for concurrent programming. For example, BLK0-3 to BLK3-3 can be selected. In this example, the selected blocks have a same relative position within their respective planes, e.g., they are closest to the sense circuits. In other examples, the selected blocks do not have a same relative position within their respective planes. For example, the selected blocks can be BLK0-3, BLK1-0, BLK2-1 and BLK3-2. Moreover, each selected block comprises a respective set of memory cells connected to a selected word line. The remaining word lines in the selected block are unselected. The same numbered word line or different numbered word lines can be selected in the selected blocks. For example, WL10 can be selected in each of P0-P3. In another example, WL10, WL20, WL15 and WL30 are selected in P0-P3, respectively.

During the multi-plane programming, a common program voltage signal is provided to each selected word line by the voltage driver 115a while a common pass voltage signal is provided to the unselected word lines in the selected blocks by the voltage driver 115b. For the unselected blocks in each plane, the word line switches can be turned off to block the word line voltage signals and therefore float the word lines.

In each program loop of the multi-plane program operation, after the voltage driver 115a applies a common program pulse to the selected word lines, it applies a common verify voltage to the selected word lines. A common program pulse is a program pulse that is applied to multiple selected word lines concurrently. A common verify voltage is a verify voltage that is applied to multiple selected word lines concurrently. In a program loop of a single plane mode, a program pulse followed by a verify voltage are applied to the selected word line of a selected block in a single selected plane. When a verify voltage is applied, the sense circuits are used to determine whether a verify test is passed.

The SGD and SGS transistors are turned on for a selected sub-block being programmed during the program pulse and the verify test. The SGD transistors are turned off for unselected sub-blocks. During a program pulse, Vbl=0 V is applied to the bit lines of selected NAND strings in a selected sub-block and Vbl=inhibit, e.g., 1.5-2 V, is applied to the bit lines of unselected NAND strings in the selected sub-block.

During a multi-plane erase operation, where charging of the channels occurs via the substrate, a common erase voltage signal can be provided to the p-well of each plane by the p-well voltage driver 115d while a common erase-enable voltage signal, e.g., 0 V, is provided to the word lines in the selected blocks by the voltage drivers 115a and 115b. For the unselected blocks in each plane, a corresponding switch (e.g., 350a-350d) can be turned off to block the erase voltage from reaching the p-well. Also, the word line switches are turned off to float the word line voltages.

When charging of the channels occurs via GIDL, the SGD and/or SGS transistors are biased for a selected block to generate holes which charge up the respective NAND string channels. For the SGD transistors, this can involve applying an erase voltage to the bit lines, which is connected to the drain of the SGD transistors and a control gate voltage to the SGD transistor which provides a back bias of about 8-10 V to the SGD transistors. A similar back bias could be provided for the SGS transistors.

In each erase loop of the multi-plane erase operation, after the p-well voltage driver 115d applies a common erase pulse, the word line drivers 115a and 115b apply a verify voltage to the word lines. In one approach, the verify voltage is applied to all word lines of a selected block concurrently. In another approach, the verify voltage is applied to odd-numbered word line while even-numbered word lines receive a pass voltage such as Vread, after which the verify voltage is applied to even-numbered word line while odd-numbered word lines receive the pass voltage. The verify test can be for an entire block, or for each sub-block in a block.

During a single plane erase operation, the transistors 350a-350d are turned off for the unselected planes, so that the p-well voltage passes to the single selected plane, in the p-well charging approach. In the GIDL approach using the SGD transistors, the erase pulse is provided on the bit lines of the selected plane while the bit line voltages of the unselected planes float. The SGD transistors of the selected block in the selected plane are driven to provide the back bias while the SGD transistor voltage of the unselected blocks in the selected plane, and of the blocks in the unselected planes, are floated.

Figure 3B:
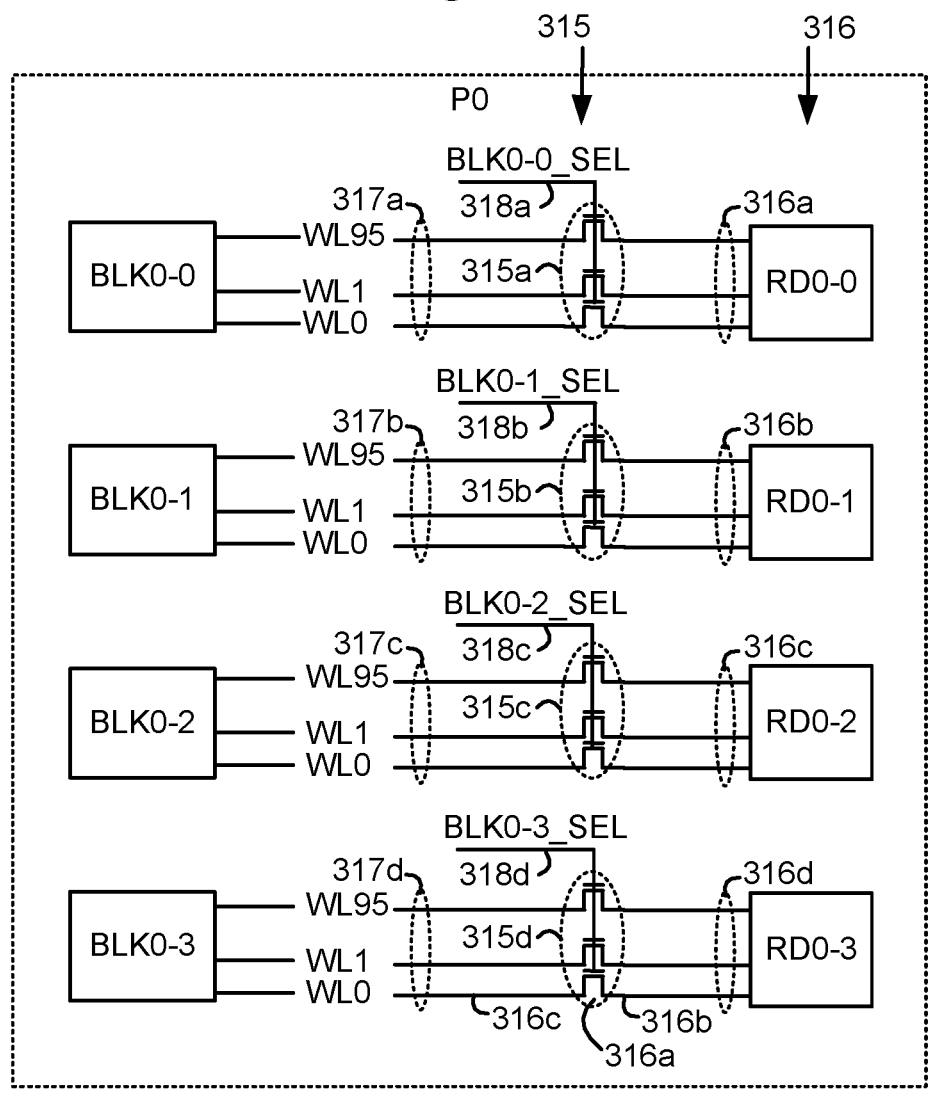
FIG. 3B is a block diagram depicting example details of the set of row decoders 316 and sets of word line switches 318 for P0 in FIG. 3A.

FIG. 3B is a block diagram depicting example details of the set of row decoders 316 and sets of word line switches 318 for P0 in FIG. 3A. The row decoders for BLK0-0 to BLK0-3 are RD0-0 to RD0-3, respectively. In this example, a set of word line switching transistors for each block is independently controlled by a respective enable signal. BLK0-0 to BLK0-3 each has a set of word line switching transistors 315a-315d, respectively, connected to its data word lines WL0-WL95. The dummy word lines and select gate lines are not depicted for simplicity. The sets of word line switching transistors 315a-315d are controlled by control signals BLK0-0_SEL to BLK0-3_SEL, respectively, on the control gate paths 318a-318d, respectively.

The row decoders RD0-0 to RD0-3 can provide respective word line voltage signals on the conductive paths 316a-316d, respectively, and the conductive paths 317a-317b, respectively, if the associated control signal is at a turn on level.

The set of word line switching transistors 315d includes an example switching transistor 316a for WL0. RD0-3 passes a word line voltage signal to the switching transistor 316a on a conductive path 316b. If the switching transistor 316a is turned on, the word line voltage signal is passed to WL0 of BLK0-0-3 on the path 316c. If the switching transistor 316a is turned off, the word line voltage signal is not passed to WL0, and a voltage floats on the path 316c.

A block which is found to be defective can be disabled from further use by providing the control signal of its word line switching transistors at a turn off level.

FIG. 3C is a block diagram depicting a respective set of memory cells connected to a selected word line in a selected block of each of the planes P0-P3 of FIG. 3A. In an example program operation, respective sets of memory cells 390a-390d are connected to respective selected word lines WLn0-0 to WLn3-0, respectively, in BLK0-0 to BLK3-0, respectively, of P0-P3, respectively. In one approach, each respective set of memory cells is in a sub-block and is a portion of the memory cells connected to the respective word line. Further, as a simplified example, the selected blocks have a same relative position within their respective planes, and the selected word lines have the same relative position within each selected block.

FIG. 4 is a perspective view of an example memory die 400 consistent with FIG. 1A, where blocks of memory cells are provided in respective planes P0-P3. The memory die includes a substrate 401, an intermediate region 402 in which blocks of memory cells are formed, and an upper region 403 in which one or more upper metal layers are patterned such as to form bit lines. Planes P0-P3 represent respective isolation regions which are formed in the substrate 401. Further, blocks sequences 405, 415, 425 and 435 of a number n blocks, labelled B0-0 to B0-*n*-1, B1-0 to B1-*n*-1, B2-0 to B2-*n*-1 and B3-0 to B3-*n*-1, are formed in P0-P3, respectively. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes.

The substrate 401 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While four planes are depicted as an example, other examples can use fewer, e.g., two, planes or more, e.g., eight, planes.

While the above example is directed to a 3D memory device with vertically extending NAND strings, the techniques provided herein are also applicable to a 2D memory device in which the NAND strings extend horizontally on a substrate.

FIG. 5 depicts an example transistor 520 in the memory structure 126 of FIG. 1A. The transistor comprises a control gate CG, a drain D, a source S and a channel CH and may represent a memory cell or a select gate transistor, for example. The control gate of the transistor is connected to a word line, the drain end of the transistor is connected to a bit line BL optionally via one or more other transistors in a NAND string, and the source end of the transistor is connected to a source line SL optionally via one or more other transistors in a NAND string.

Figure 6A:
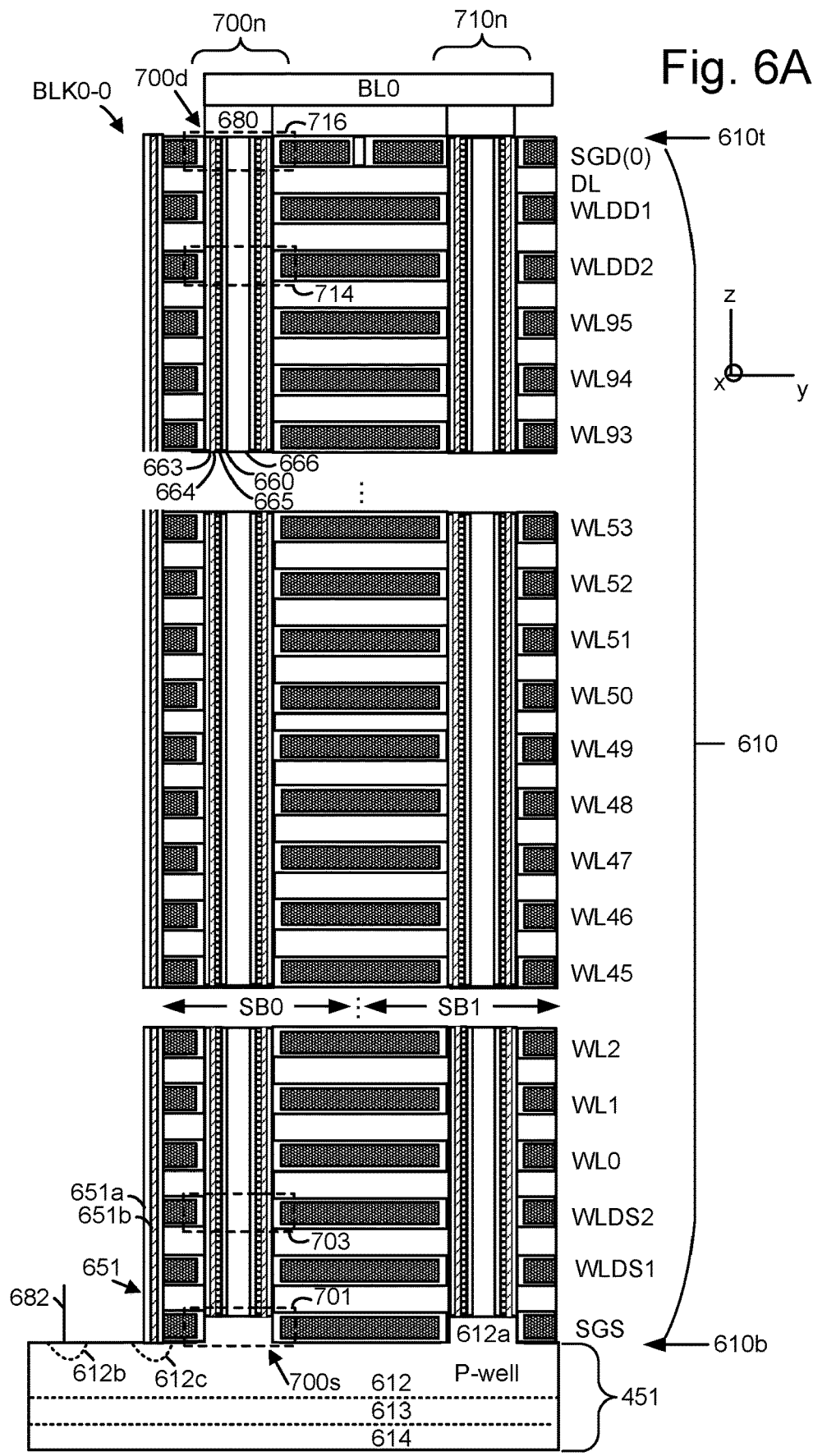
FIG. 6A depicts an example cross-sectional view of a portion of the block BLK0-0 of FIG. 4, including NAND strings 700n and 710n, in a single-tier stack.

FIG. 6A depicts an example cross-sectional view of a portion of the block BLK0-0 of FIG. 4, including NAND strings 700*n* and 710*n*, in a single-tier stack. In this example, the NAND strings 700*n* and 710*n* are in different sub-blocks SB0 and SB1, respectively, and are connected to a common bit line, BL0. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A controller considers the data memory cells to be eligible to store user data. In this example, the stack includes ninety-six data word lines, WL0-WL95. More WL layers, or fewer WL layers, can also be used in this technology for variations. The data word lines are separated by dielectric layers. DL is an example dielectric layer.

The conductive layers connected to control gates of dummy memory cells are referred to as dummy word lines. Dummy memory cells can have the same construction as data memory cells but are considered by the controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 6B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 610*t* and bottom 610*b* of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 451. In one approach, the substrate includes a p-well region 612 connected to the source ends of the NAND strings. The p-well region may comprise epitaxial regions 612*a* which extend upward adjacent to the source-side select gate transistors. The p-well region can include an n+ contact 612*c* connected to a local interconnect 651 for receiving a source line voltage, and a p+ contact 612*b* connected to a conductive path 682 for receiving a p-well voltage. The local interconnect 651 can comprise a conductive material 651*b* such as metal surrounded by insulating material 651*a* to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

In this example, the SGS transistors do not include the multiple thin layers 660, 663, 664 and 665.

Figure 6B:
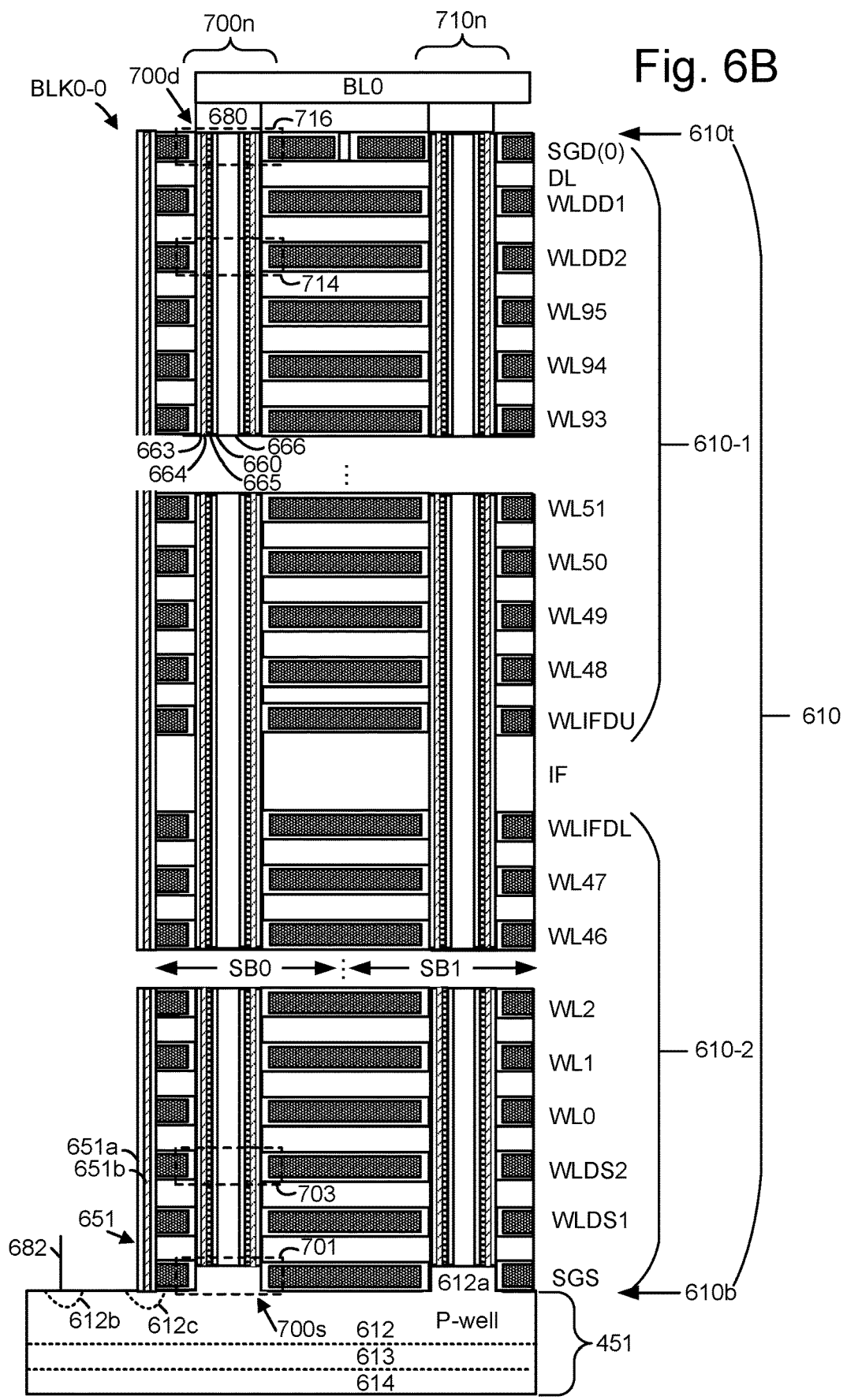
FIG. 6B depicts an example cross-sectional view of a portion of the block BLK0-0 of FIG. 4, including NAND strings 700n and 710n, in a two-tier stack comprising an upper tier 610-1 and a lower tier 610-2.

FIG. 6B depicts an example cross-sectional view of a portion of the block BLK0-0 of FIG. 4, including NAND strings 700n and 710n, in a two-tier stack comprising an upper tier 610-1 and a lower tier 610-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

FIG. 6C depicts an example plot of memory hole width versus height in the NAND string 700n of FIG. 6A. The width of a memory hole can vary in the vertical direction due to variations in the etching process. Generally, the width is progressively greater higher in the memory hole. A selected word line in a program operation, WLn, is at a height (z) above the substrate and will have a program or erase speed which is a function of a corresponding width of the memory hole at that height. WLn is connected to a set of memory cells being programmed. The width can be classified into three groups, for example, including a first group 690a which has a relatively small width, a second group 690b which has a moderate width, and a third group 690c which has a relatively large width, on average.

FIG. 6D depicts an example plot of memory hole width versus height in the NAND string 700na of FIG. 6B. The memory hole profile for each tier is similar to the profile depicted in FIG. 6C. For each tier, the width can be classified into three groups. For example, the bottom tier (BT) includes a first group 695a which has a relatively small width, a second group 695b which has a moderate width, and a third group 695c which has a relatively large width, on average. The top tier (TT) includes a first group 696a which has a relatively small width, a second group 696b which has a moderate width, and a third group 696c which has a relatively large width.

Figure 19:
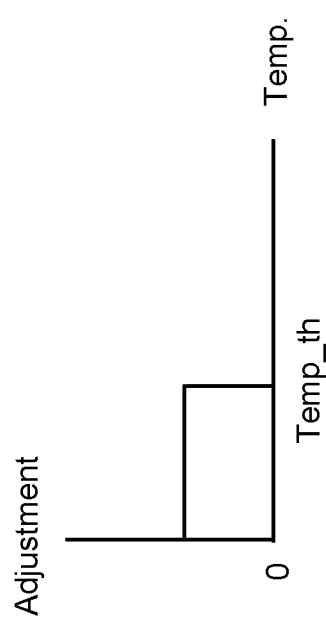
FIG. 19 is an example plot of an adjustment to SPM_trigger, WLLD_trigger, NPL_max or NEL_max as a function of memory hole width, consistent with FIGS. 6C, 6D and 14A-16B.

As described in FIG. 19, the memory hole width can be used to adjust a trigger program or erase loop and/or maximum allowable number of program or erase loops in a process which prevents neighbor plane disturb.

Figure 7A:
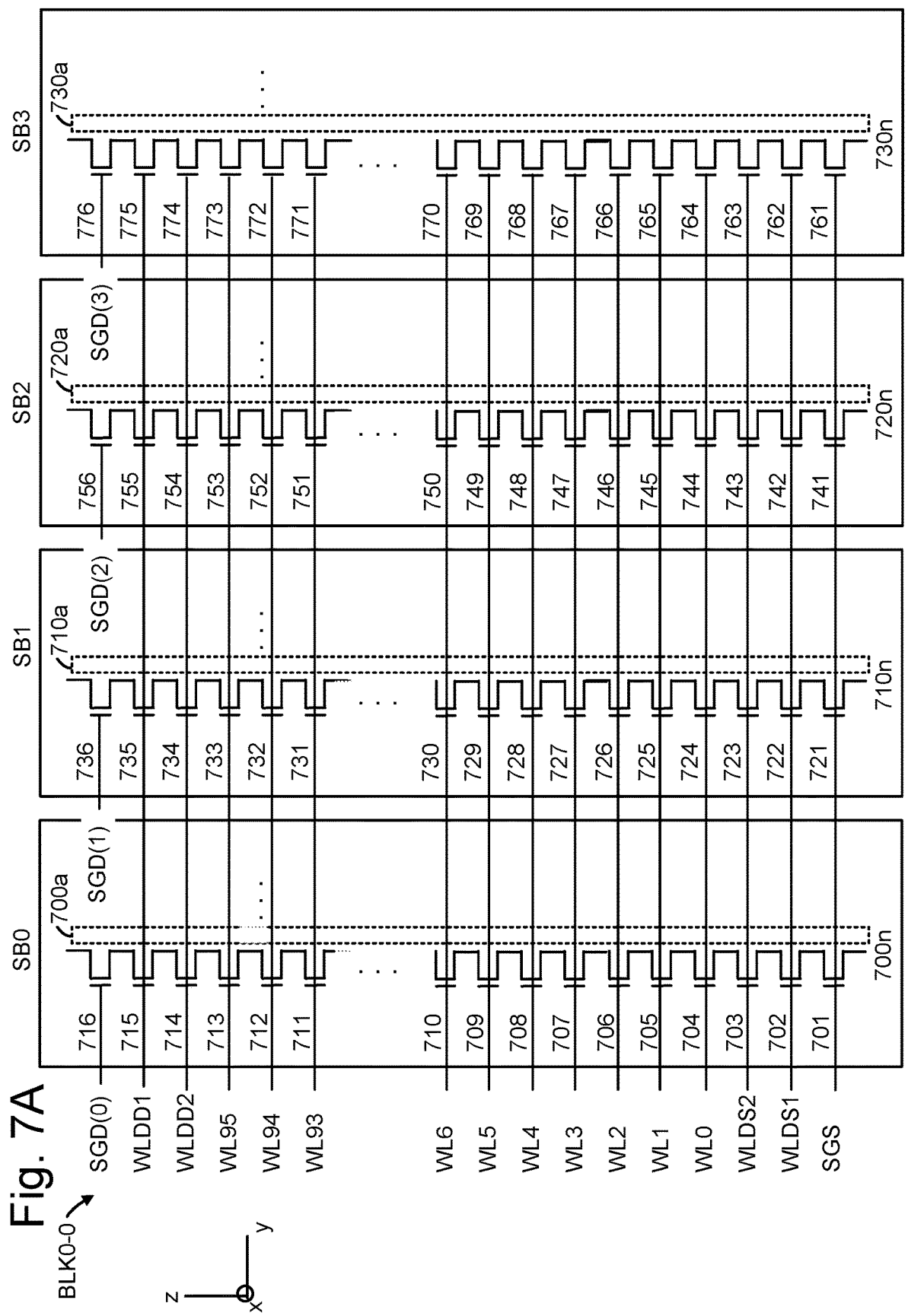
FIG. 7A depicts an example view of NAND strings in the block BLK0-0 which is consistent with FIGS. 4 and 6A.

FIG. 7A depicts an example view of NAND strings in the block BLK0-0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible.

The plurality of memory cells of BLK0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, source-side dummy memory cells 702 and 703, data memory cells 704-713, drain-side dummy memory cells 714 and 715 and SGD transistor 716. NAND string 710n includes SGS transistor 721, source-side dummy memory cells 722 and 723, data memory cells 724-733, drain-side dummy memory cells 734 and 735 and SGD transistor 736. NAND string 720n includes SGS transistor 741, source-side dummy memory cells 742 and 743, data memory cells 744-753, drain-side dummy memory cells 754 and 755 and SGD transistor 756. NAND string 730n includes SGS transistor 761, source-side dummy memory cells 762 and 763, data memory cells 764-773, drain-side dummy memory cell 774 and 775 and SGD transistor 776.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 may be driven by separate control lines SGD(0), SGD(1), SGD(2) and SGD(3), respectively, in one approach.

FIG. 7B depicts an example top view of the block BLK0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

Figure 8:
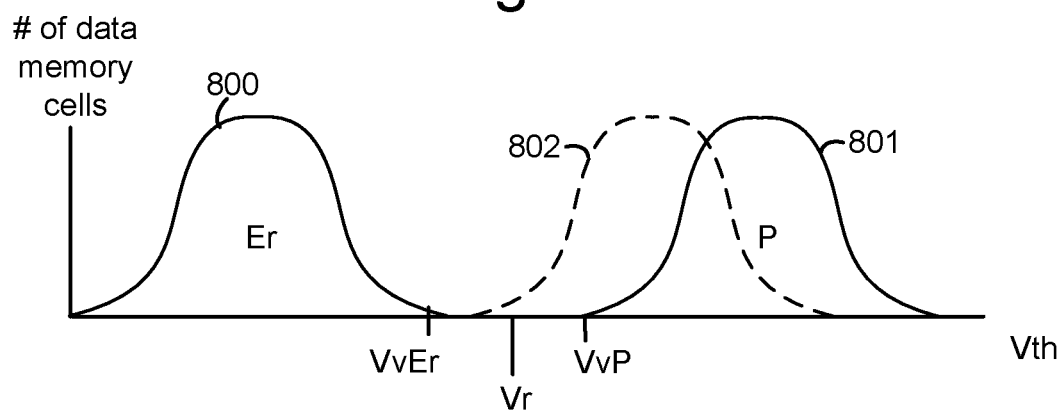
FIG. 8 depicts threshold voltage (Vth) distributions for memory cells in a single bit per cell memory device.

FIG. 8 depicts threshold voltage (Vth) distributions for memory cells in a single bit per cell memory device. The vertical axis depicts a number of memory cells on a logarithmic scale and the horizontal axis depicts a threshold voltage on a linear scale. The Vth distributions can represent memory cells connected to a word line in a block. After erasing the block, the Vth distribution 800 is obtained, representing the erased state. The erase operation is completed when the Vth of all, or nearly all, of the data memory cells is below an erase verify voltage, VvEr.

The memory cells are then subject to a programming operation. For SLC memory cells, there is one programmed state (P). Some of the memory cells are assigned to the erased state (Er) and are not programmed. Other memory cells are programmed to the P state as represented by the Vth distributions 801, when there is no neighbor plane disturb. These memory cells are subject to a verify test using a verify voltage of VvP. The memory cells which are assigned to the P state complete programming when all, or nearly all, e.g., at least 95-99%, of the memory cells have a Vth greater than the verify voltage. A lockout condition is reached for a memory cell when its Vth is greater than the verify voltage, such that the memory cell passes its verify test.

The Vth distribution 802 may be obtained for memory cells which are subject to neighbor plane disturb. As mentioned, the disturb can cause a pull down of a program voltage or a pull up of a verify voltage on the selected word line. This case represents a pull down of the program voltage such that the Vth distribution 802 is lower than the desired Vth distribution 801. The lower tail of the Vth distribution 802 is lower than the read voltage Vr such that read errors will occur.

Figure 9:
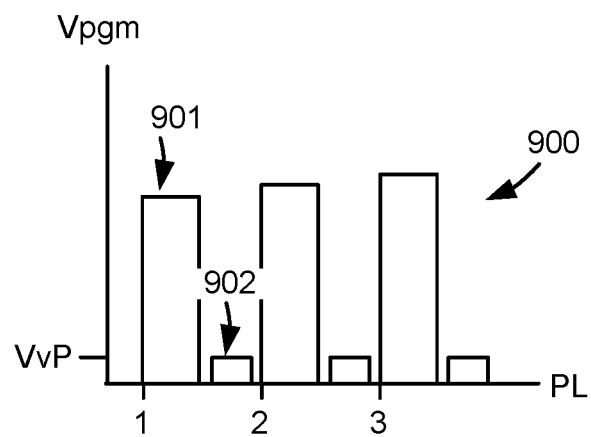
FIG. 9 depicts an example voltage signal 900 in a program operation, consistent with FIG. 8.

FIG. 9 depicts an example voltage signal 900 in a program operation, consistent with FIG. 8. In this example, the voltage signal includes three program-verify loops, PL1-PL3. As mentioned, the number of program loops in SLC programming is relatively small compared to MLC programming. Each loop includes a program pulse and a verify voltage. For example, a program pulse (plot 901) and a verify voltage (plot 902) are provided in PL1. The peak magnitudes of the program pulses may increase in consecutive program loops as depicted, in a technique referred to as incremental step pulse programming.

Figure 10:
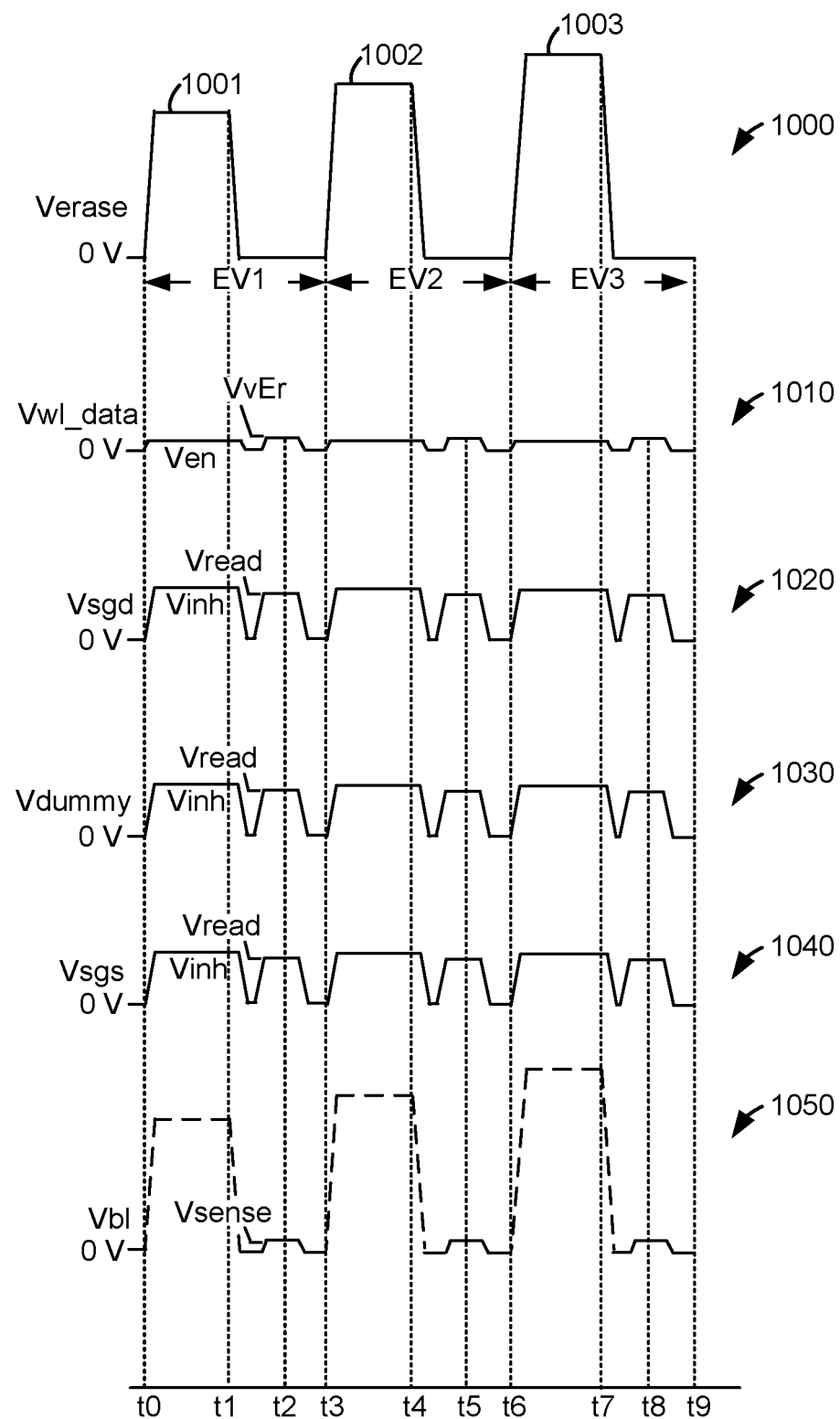
FIG. 10 depicts example voltage signals of an erase operation, consistent with FIG. 8.

FIG. 10 depicts example voltage signals of an erase operation, consistent with FIG. 8. The voltage signals extend over time points t0-t9. The vertical direction indicates voltage, and the horizontal direction indicates time. In this example, the erase operation has three erase-verify loops, EV1-EV3. An erase operation typically has multiple erase-verify loops. Each loop has an erase portion in which an erase pulse is applied to charge up the NAND string channels. The erase portion is followed by a verify portion which can include an erase-verify test for the memory cells.

A voltage signal 1000 depicts Verase including erase pulses 1001-1003. The first, second and third erase pulses are at t0-t1, t3-t4 and t6-t7, respectively. The erase voltage can involve a transition from 0 V to a peak voltage, e.g., 15-25 V, which is stepped up in successive erase-verify iterations after the first erase-verify iteration. The channel voltage of the NAND strings will be similar to, and slightly less than, Verase. In this example, the erase pulse is applied to the p-well.

A voltage signal 1010 depicts a voltage applied to the data word lines, Vwl_data. This voltage signal increases from 0 V to Ven during each erase pulse. Ven is an erase-enable voltage such as 0-0.5 V. Between the erase pulses, in the verify portion of the erase-verify loops, Vwl_data is set to an erase-verify voltage, VvEr, such as 0 V, at which time a sensing operation (verify test) occurs. The sensing occurs at t2, t5 and t8.

A voltage signal 1020 depicts a voltage applied to the SGD transistors, Vsgd. This voltage signal increases from 0 V to Vinh, an inhibit voltage, during each erase pulse. In the verify portion of the erase-verify loops, Vsgd is set to Vread. Vinh is an erase-inhibit voltage such as 10 V, and Vread is a read pass voltage such as 8-10 V. The verify test can be performed for all word lines of a block concurrently. Or, a verify test for the odd-numbered word lines can be separate from a verify test for the even-numbered word lines.

A voltage signal 1030 depicts a voltage applied to dummy word lines. This voltage signal increases from 0 V to Vinh during each erase pulse. In the verify portion of the erase-verify loops, Vdummy is set to Vread.

A voltage signal 1040 depicts a voltage applied to the SGS transistors, Vsgs. This voltage signal increases from 0 V to Vinh during each erase pulse. In the verify portion of the erase-verify loops, Vsgs is set to Vread.

A voltage signal 1050 depicts a voltage of the bit lines. The bit line voltage Vbl increases as the channel voltage increases, in concert with Verase. The dashed lines denote a floating voltage. In the verify portion of the erase-verify loops, Vbl is set to Vsense, a sensing voltage of the bit line such as 0.8 V.

Figure 11A:
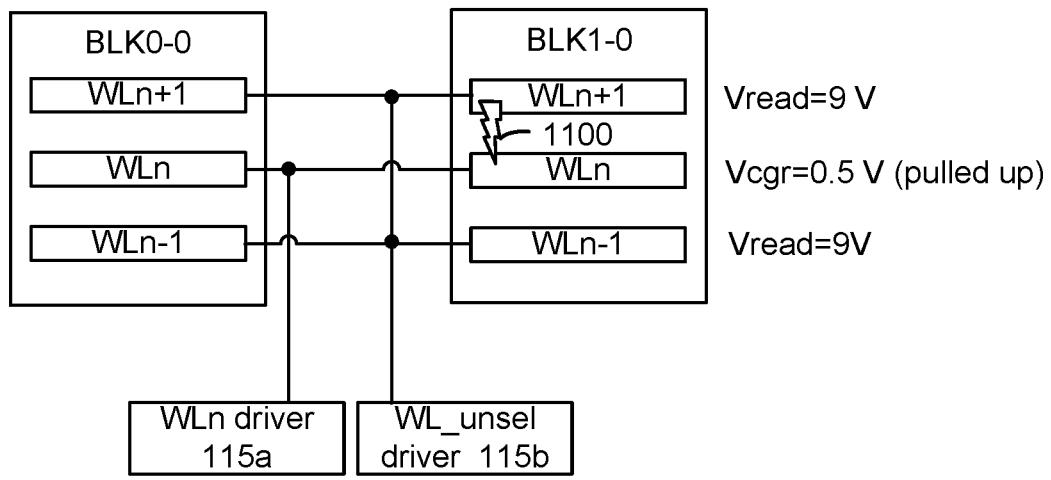
FIG. 11A depicts an example short circuit between word lines which results in a voltage pull up on the selected word line WLn in a verify test, consistent with FIG. 3A.

FIG. 11A depicts an example short circuit between word lines which results in a voltage pull up on the selected word line WLn in a verify test, consistent with FIG. 3A. BLK0-0 and BLK1-0 from FIG. 3A are repeated. Blocks in other planes may also optionally be present. The WLn driver 115a is connected to WLn in both blocks and provides a verify voltage of Vcgr=0.5 V. The WL_unsel driver 115b is connected to the unselected word lines in both blocks, including WLn−1 and WLn+1, and provides a voltage of Vread=9 V. In this example, a short circuit or leaky path 1100 is present between WLn and WLn+1 in BLK1-0. The leaky path results in the higher voltage Vread on WLn+1 pulls up the lower voltage on WLn, in both BLK0-0 and BLK1-0, and any blocks which are concurrently programmed in a multi-plane operation, since the word line voltages are commonly provided to each block. Since the verify test is corrupted, the P state memory cells are not programmed to the correct level.

Figure 11B:
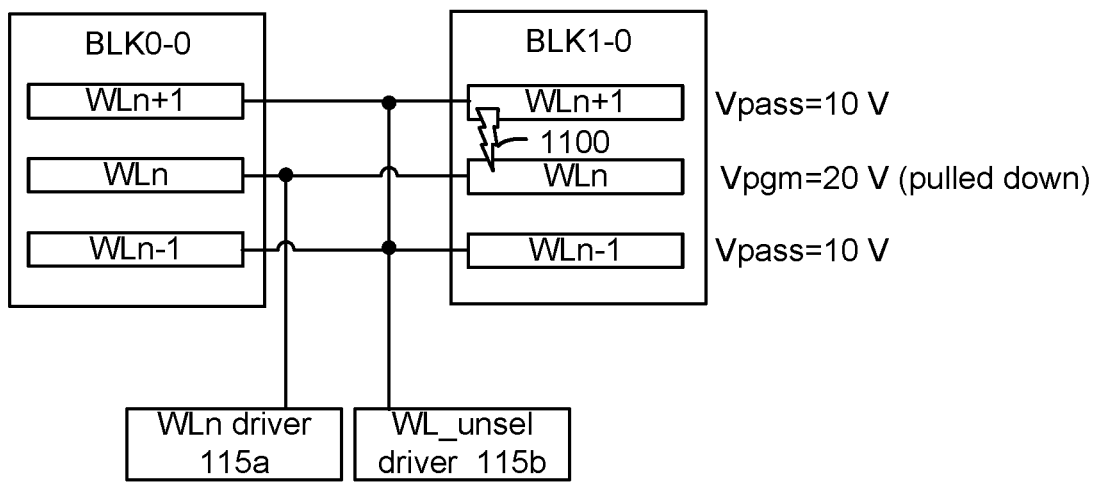
FIG. 11B depicts an example short circuit between word lines which results in a voltage pull down on the selected word line WLn during a program pulse, consistent with FIG. 3A.

FIG. 11B depicts an example short circuit between word lines which results in a voltage pull down on the selected word line WLn during a program pulse, consistent with FIG. 3A. The WLn driver 115a is connected to WLn in both blocks and provides a program voltage of Vpgm=20 V. The WL_unsel driver 115b is connected to the unselected word lines in both blocks, including WLn−1 and WLn+1, and provides a voltage of Vpass=10 V. In this example, the short circuit or leaky path 1100 is again present between WLn and WLn+1 in BLK1-0. The leaky path results in the lower voltage Vpass on WLn+1 pulling down the higher voltage on WLn, in both BLK0-0 and BLK1-0, and any blocks which are concurrently programmed in a multi-plane operation, since the word line voltages are commonly provided to both blocks. Since the program voltage is corrupted, the P state memory cells may not be programmed to the correct level within the maximum allowable number of program loops.

The reason that the voltage on WLn is pulled up or down in these examples by the voltage on the unselected word lines is that WL_unsel driver is configured to drive the multiple unselected word lines which have a higher capacitance than the single selected word line in each block. The voltage from the WL_unsel driver therefore dominates over the voltage from the WLn driver.

Figure 12:
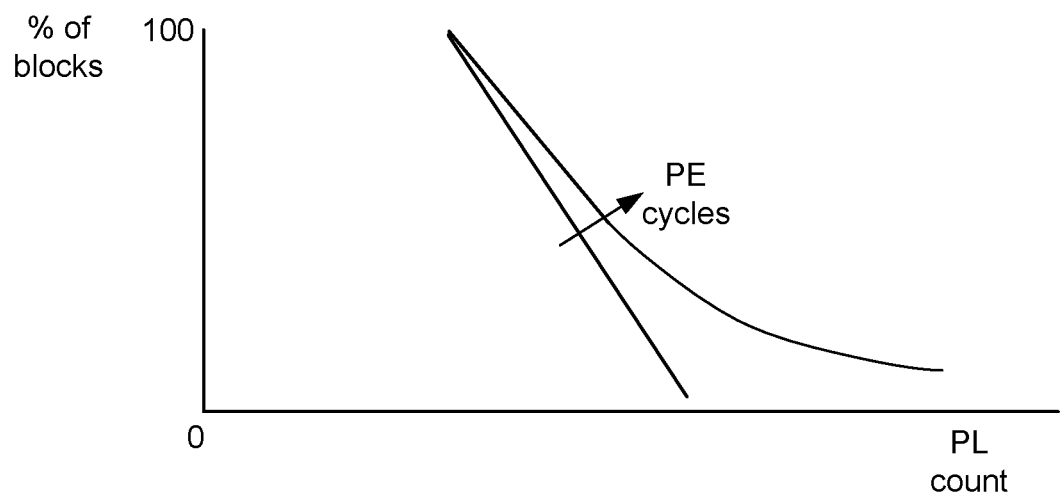
FIG. 12 depicts a plot of a % of blocks which complete programming, on a log scale, versus a program loop (PL) count, on a linear scale, in different SLC program operations.

FIG. 12 depicts a plot of a % of blocks which complete programming, on a log scale, versus a program loop (PL) count, on a linear scale, in different SLC program operations. In this example, a large majority of the blocks of memory cells complete programming after a single program loop. A very small number require two or three program loops to complete programming. Moreover, the number of program loops needed to complete programming is an increasing function of the number of program-erase (P-E) cycles. That is, as the memory device ages and the number of P-E cycles increases, the number of program loops needed to complete programming can increase. By setting the maximum allowable number of loops appropriately, a set of memory cells which does not complete a program or erase operation within the maximum allowable number of loops can be identified as being faulty.

In one approach, described further below, e.g., in connection with FIG. 20, the techniques described herein for reducing neighbor plane disturb can be adjusted based on the number of P-E cycles.

Figure 13:
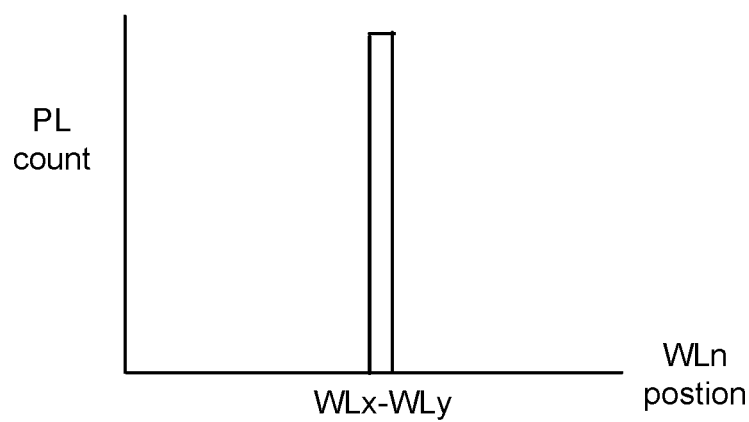
FIG. 13 depicts a plot of a PL count versus a position of the selected word line WLn, where a short circuit affects word lines WLx-WLy.

FIG. 13 depicts a plot of a PL count versus a position of the selected word line WLn, where a short circuit affects word lines WLx-WLy. In this example, a short circuit or leaky path encompasses a number of adjacent word lines, resulting in a sharply higher number of program loops needed to complete programming for the respective memory cells of these word lines. In some cases, programming cannot be completed for these word lines.

As discussed further below, the techniques of FIGS. 14A-14D, 16A and 16B prevent neighbor plane disturb by forcing a switch from a multi-plane mode to a single plane mode to detect and isolate a faulty block/plane. The techniques of FIGS. 15A-15B and 16C prevent neighbor plane disturb by diagnosing and isolating a faulty block/plane while remaining in a multi-plane mode.

Figure 14A:
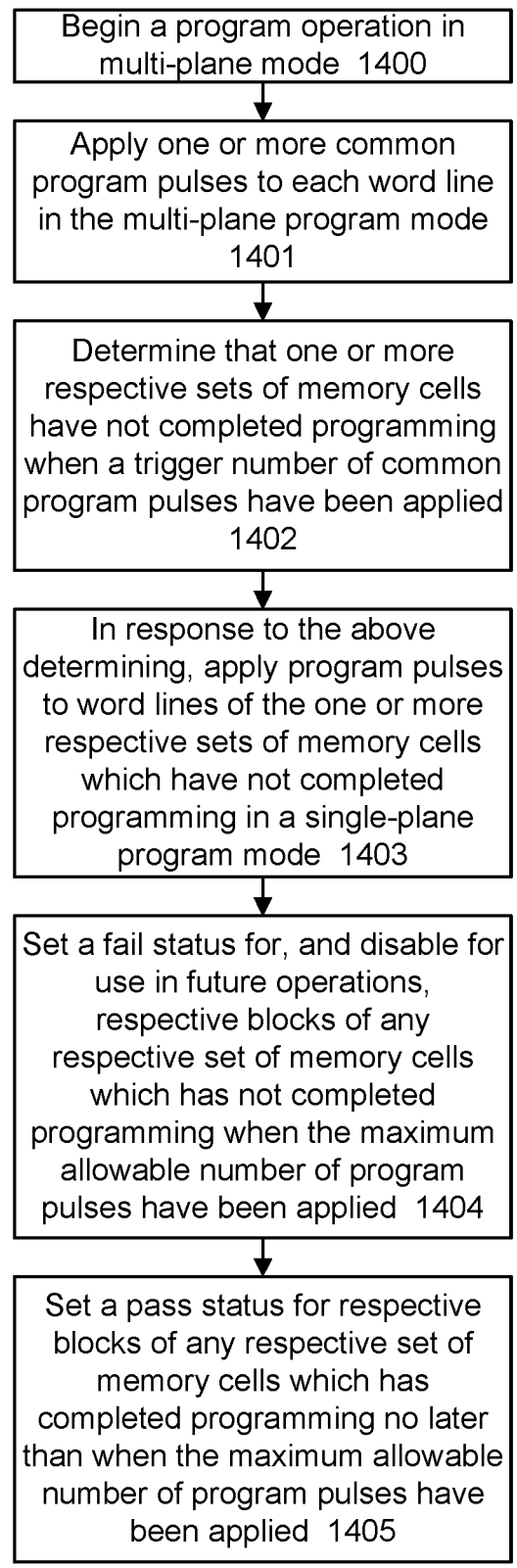
FIG. 14A depicts a flowchart of a process for identifying a faulty block of memory cells by switching from a multi-plane operation to a single-plane operation during programming.

FIG. 14A depicts a flowchart of a process for identifying a faulty block of memory cells by switching from a multi-plane operation to a single-plane operation during programming. Step 1400 begins a program operation in a multi-plane mode. Step 1401 includes applying one or more common program pulses to each selected word line in the multi-plane program mode. Each selected word line is in a selected block in a respective plane and is connected to a respective set of memory cells. See FIG. 3C, for example.

Generally, the programming of a plurality of respective sets of memory cells in the multi-plane mode comprises applying a common program pulse to each of the plurality of respective sets of memory cells in at least a first program-verify iteration of the trigger number of program-verify iterations. After the first program-verify iteration (PL0), some of the blocks may pass verify such that just one block remains unprogrammed at the second program-verify iteration. This remaining block will be programmed in a single-plane mode in this case.

Step 1402 includes determining that one or more respective sets of memory cells have not completed programming when a trigger number of common program pulses have been applied. Step 1403 includes, in response to the above determining, applying program pulses to word lines of the one or more respective sets of memory cells which have not completed programming in a single-plane program mode. The single-plane program mode involves programming one block/plane at a time and helps isolate a defective plane to avoid neighbor plane disturb effects such as word line pull up or down on other, good blocks in their respective planes. This allows the good blocks/planes to continue programming without being affected by neighbor plane disturb from any defective blocks/planes.

Step 1404 includes setting a fail status for, and disabling for use in future operations, respective blocks of any respective set of memory cells which has not completed programming when the maximum allowable number of program pulses have been applied. Step 1405 includes setting a pass status for respective blocks of any respective set of memory cells which has completed programming no later than when the maximum allowable number of program pulses have been applied. This can include blocks which complete programming by the time the trigger number of common program pulses have been applied, e.g., when the number of common program pulses is no greater than the trigger number, and blocks which complete programming after the trigger number of common program pulses have been applied, but no later than when the maximum allowable number of program pulses have been applied.

When another multi-plane operation is later performed, the defective blocks are not used so that neighbor plane disturb is avoided.

In one approach, the common program pulses in the multi-plane mode and the program pulses in the single-plane mode are applied by a single voltage driver, e.g., the WLn driver 115a of FIG. 3A.

Figure 14B:
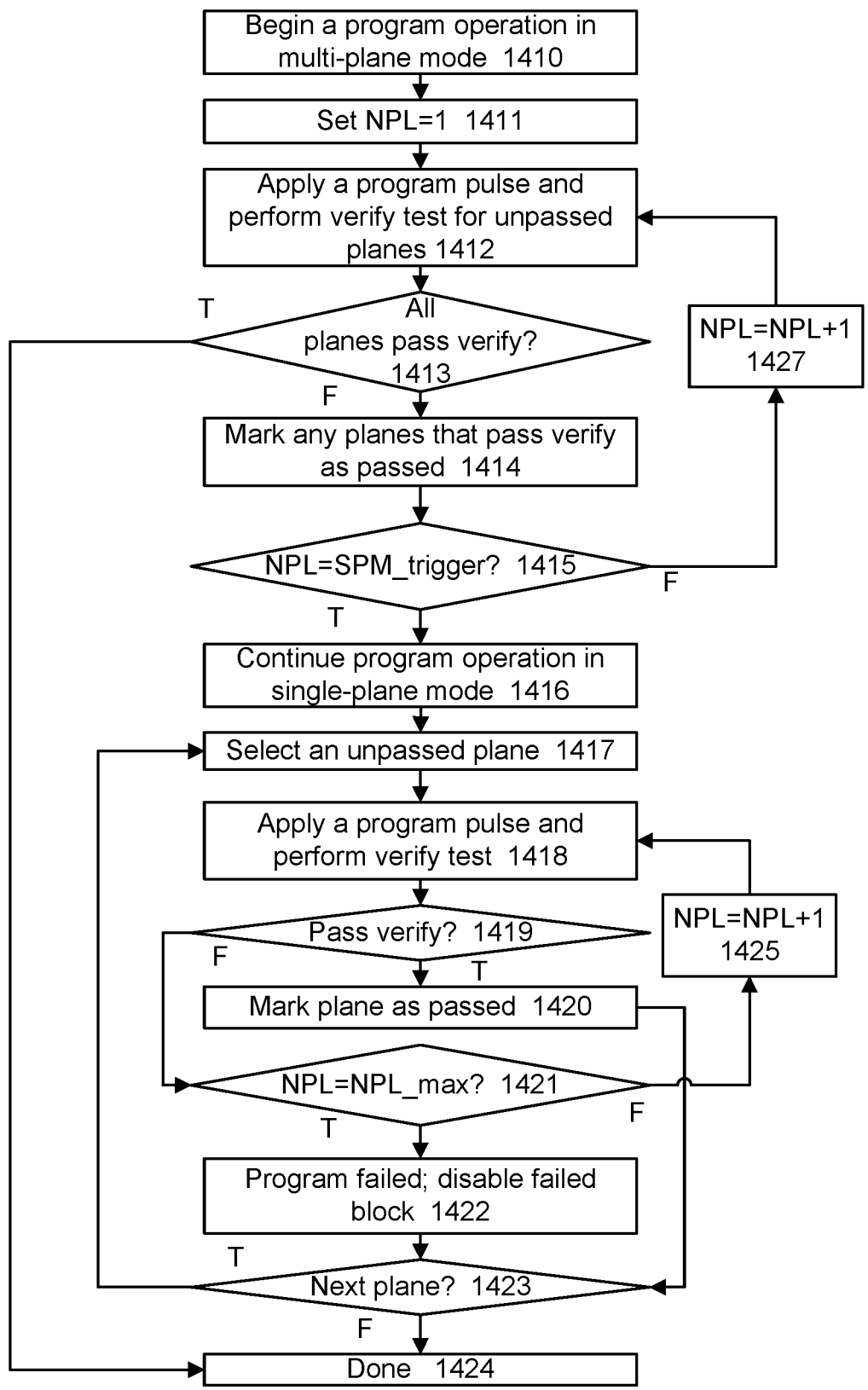
FIG. 14B depicts a flowchart of a program operation consistent with FIG. 14A, where a trigger (SPM_trigger) for switching from a multi-plane operation to a single-plane operation, and a maximum allowable number of program loops (NPL_max) are predetermined.

FIG. 14B depicts a flowchart of a program operation consistent with FIG. 14A, where a trigger (SPM_trigger) for switching from a multi-plane operation to a single-plane operation, and a maximum allowable number of program loops (NPL_max) are predetermined. Step 1410 begins a program operation in multi-plane mode. Step 1411 sets the number of program loops, NPL=1. Step 1412 applies a program pulse and performs a verify test for unpassed planes, e.g., blocks/planes which have not yet completed programming. A decision step 1413 determines whether all planes/blocks have passed verify. If the decision step 1413 is true (T), the program operation is done at step 1424. If the decision step 1413 is false (F), step 1414 includes marking any planes/blocks that pass verify as passed.

A decision step 1415 determines whether NPL=SPM_trigger, a trigger number of program loops for initiating single-plane mode (SPM) programming. If the decision step is false, NPL is incremented by one at step 1427 and step 1412 is repeated in a next program loop. If the decision step 1415 is true, step 1416 continues the program operation in a single-plane mode. In this case, step 1417 selects an unpassed plane/block. Step 1418 applies a program pulse and performs a verify test for the selected plane/block. A decision step 1419 determines whether the plane/block passes the verify test. If the decision step 1419 is true, step 1420 marks the plane/block as passed and a decision step 1423 determines whether there is a next plane to program in the single-plane mode. If the decision step 1423 is false, the program operation is done at step 1424. If the decision step 1423 is true, step 1417 is reached to select a next plane/block to program in the single-plane mode. In the single-plane mode, a separate NPL is maintained for each block/plane so that NPL=SPM_trigger when the next block/plane is selected at step 1417.

If the decision step 1419 is false, a decision step 1421 determines whether NPL=NPL_max, the maximum allowable number of program loops. If the decision step 1421 is false, NPL is incremented at step 1425 and step 1418 is reached again for a next program loop. If the decision step 1421 is true, step 1422 indicates that programming of the plane/block has failed, and the block is disabled.

In an example implementation, SPM_trigger=2 program loops and NPL_max=3 program loops. In this case, the single-plane programming is allowed to perform just one program loop for each unpassed plane/block.

Figure 14C:
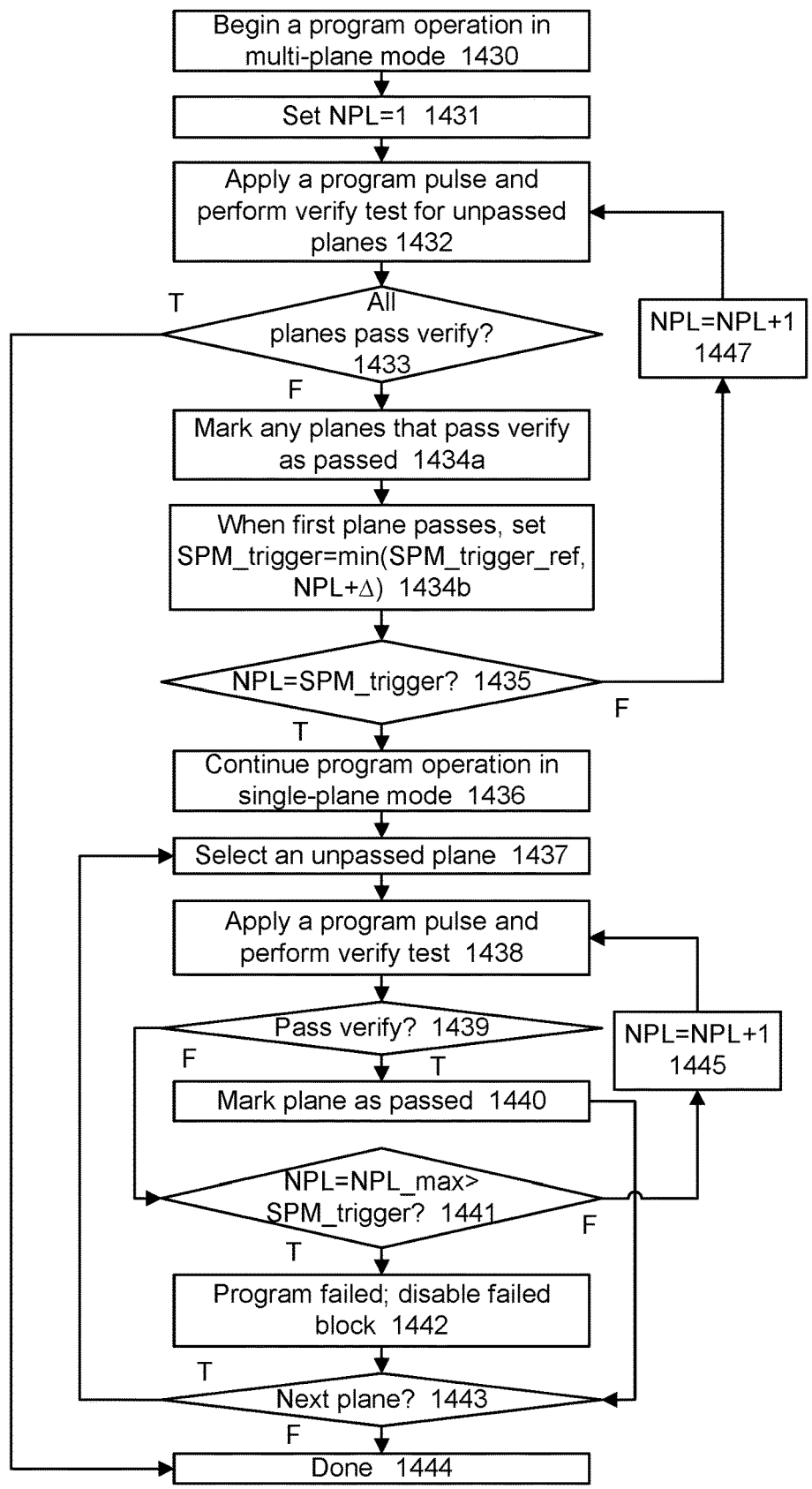
FIG. 14C depicts a flowchart of a program operation consistent with FIG. 14A, where a trigger (SPM_trigger) for switching from a multi-plane operation to a single-plane operation is set adaptively, and a maximum allowable number of program loops (NPL_max) is predetermined.

FIG. 14C depicts a flowchart of a program operation consistent with FIG. 14A, where a trigger (SPM_trigger) for switching from a multi-plane operation to a single-plane operation is set adaptively, and a maximum allowable number of program loops (NPL_max) is predetermined. The trigger is set adaptively, e.g., during the program operation. Step 1430 begins a program operation in multi-plane mode. Step 1431 sets NPL=1. Step 1432 applies a program pulse and performs a verify test for unpassed planes. A decision step 1433 determines whether all planes/blocks have passed verify. If the decision step 1433 is true, the program operation is done at step 1444. If the decision step 1433 is false, step 1434a includes marking any planes/blocks that pass verify as passed.

Step 1434b includes, when a first plane/block passes verify, setting SPM_trigger=min(SPM_trigger ref, NPL+Δ). SPM_trigger ref is a predetermined reference value such as three program loops while Δ is a predetermined delta such as one program loop. NPL is the current number of program loops which have been used so far in the program operation in the multi-plane mode. This approach allows SPM_trigger to be set to a lower value than SPM_trigger ref if the first plane/block passes verify relatively early in the program operation. This indicates the blocks are likely to be relatively fast programming such that a reduction in SPM_trigger is appropriate. This is an example of the trigger number being an increasing function of a program loop at which a set of memory cells of the respective sets of memory cells first completes programming. Generally, the trigger number is lower or higher when this program loop is lower or higher, respectively.

A decision step 1435 determines whether NPL=SPM_trigger. If the decision step is false, NPL is incremented by one at step 1447 and step 1432 is repeated in a next program loop. If the decision step 1435 is true, step 1436 continues the program operation in a single-plane mode. Step 1437 selects an unpassed plane/block. Step 1438 applies a program pulse and performs a verify test for the selected plane/block. A decision step 1439 determines whether the plane/block passes the verify test. If the decision step 1439 is true, step 1440 marks the plane/block as passed and a decision step 1443 determines whether there is a next plane to program in the single-plane mode. If the decision step 1443 is false, the program operation is done at step 1444. If the decision step 1443 is true, step 1437 is reached to select a next plane/block to program in the single-plane mode. In the single-plane mode, a separate NPL is maintained for each block/plane so that NPL=SPM_trigger when the next block/plane is selected at step 1437.

If the decision step 1439 is false, a decision step 1441 determines whether NPL=NPL_max, where NPL_max>SPM_trigger. If the decision step 1441 is false, NPL is incremented at step 1445 and step 1438 is reached again for a next program loop. If the decision step 1441 is true, step 1442 indicates that programming of the plane/block has failed, and the block is disabled.

In an example implementation, NPL_max=4 program loops.

Figure 14D:
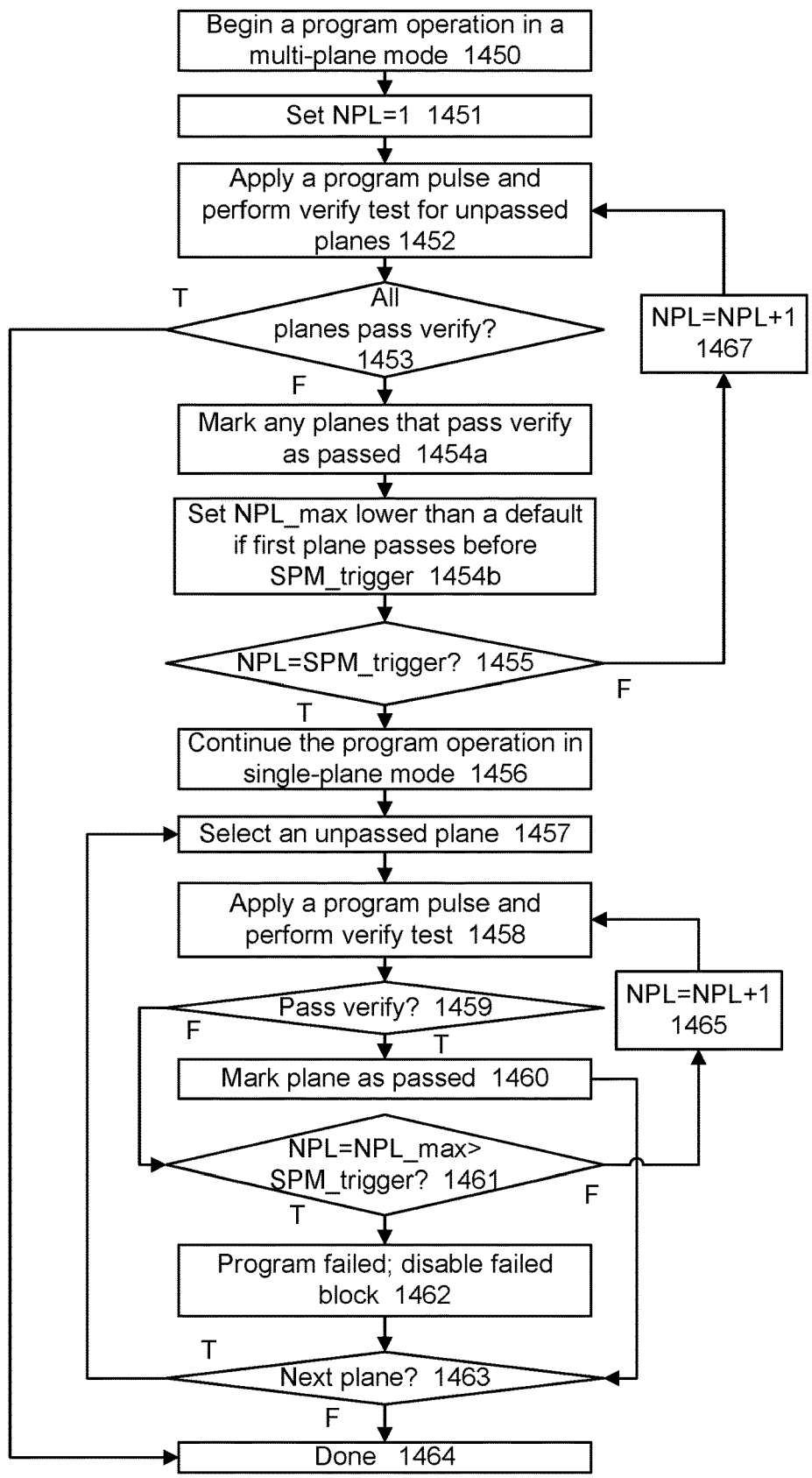
FIG. 14D depicts a flowchart of a program operation consistent with FIG. 14A, where a trigger (SPM_trigger) for switching from a multi-plane operation to a single-plane operation is predetermined, and a maximum allowable number of program loops (NPL_max) is set adaptively.

FIG. 14D depicts a flowchart of a program operation consistent with FIG. 14A, where a trigger (SPM_trigger) for switching from a multi-plane operation to a single-plane operation is predetermined, and a maximum allowable number of program loops (NPL_max) is set adaptively. Step 1450 begins a program operation in multi-plane mode. Step 1451 sets NPL=1. Step 1452 applies a program pulse and performs a verify test for unpassed planes. A decision step 1453 determines whether all planes/blocks have passed verify. If the decision step 1453 is true, the program operation is done at step 1464. If the decision step 1453 is false, step 1454a includes marking any planes/blocks that pass verify as passed.

Step 1454b includes setting NPL_max lower than a default if a first plane/block passes verify before SPM_trigger. In an example implementation with SPM_trigger=2, NPL_max=3 if a plane/block first passes at NPL=1, and NPL_max=4 if plane/block first passes at NPL=2 or if no plane passes before SPM_trigger. This is an example of the maximum allowable number being an increasing function of a program loop at which a set of memory cells of the respective sets of memory cells first completes programming.

A decision step 1455 determines whether NPL=SPM_trigger. If the decision step is false, NPL is incremented by one at step 1467 and step 1452 is repeated in a next program loop. If the decision step 1455 is true, step 1456 continues the program operation in a single-plane mode. Step 1457 selects an unpassed plane/block. Step 1458 applies a program pulse and performs a verify test for the selected plane/block. A decision step 1459 determines whether the plane/block passes the verify test. If the decision step 1459 is true, step 1460 marks the plane/block as passed and a decision step 1463 determines whether there is a next plane to program in the single-plane mode. If the decision step 1463 is false, the program operation is done at step 1464. If the decision step 1463 is true, step 1457 is reached to select a next plane/block to program in the single-plane mode. In the single-plane mode, a separate NPL is maintained for each block/plane so that NPL=SPM_trigger when the next block/plane is selected at step 1457.

If the decision step 1459 is false, a decision step 1461 determines whether NPL=NPL_max, where NPL_max>SPM_trigger. If the decision step 1461 is false, NPL is incremented at step 1465 and step 1458 is reached again for a next program loop. If the decision step 1461 is true, step 1462 indicates that programming of the plane/block has failed, and the block is disabled.

Figure 15A:
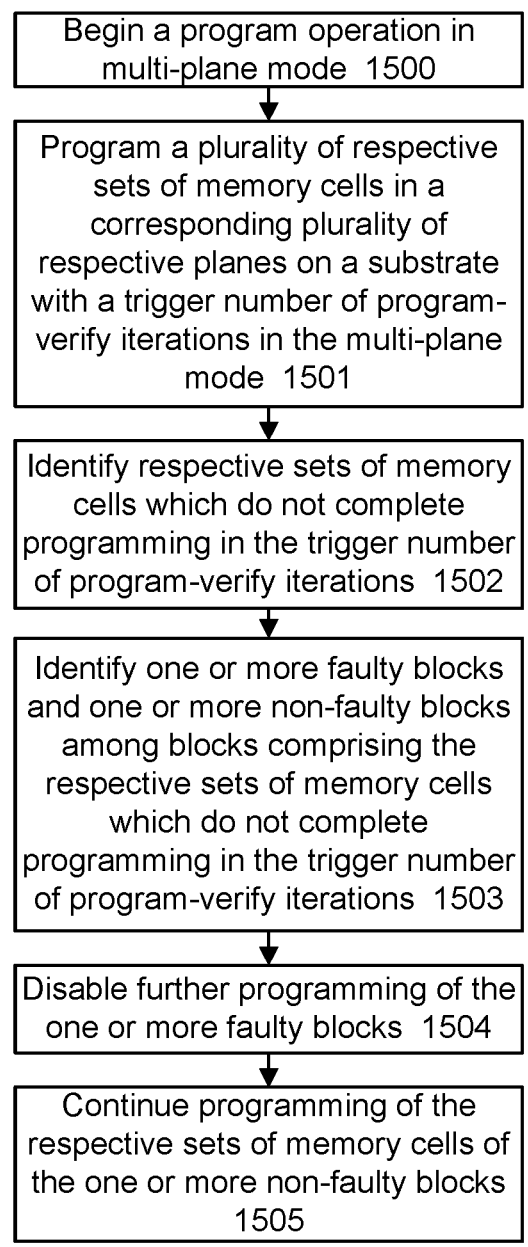
FIG. 15A depicts a flowchart of a process for identifying a faulty block of memory cells by performing a word line leakage detection operation while programming in a multi-plane operation.

FIG. 15A depicts a flowchart of a process for identifying a faulty block of memory cells by performing a word line leakage detection operation while programming in a multi-plane operation. Step 1500 begins a program operation in a multi-plane mode. Step 1501 includes programming a plurality of respective sets of memory cells in a corresponding plurality of respective planes on a substrate with a trigger number of program-verify iterations in the multi-plane mode. Step 1502 includes identifying respective sets of memory cells which do not complete programming in the trigger number of program-verify iterations. Step 1503 includes identifying one or more faulty blocks and one or more non-faulty blocks among blocks comprising the respective sets of memory cells which do not complete programming in the trigger number of program-verify iterations. For example, this can involve performing a word line leakage detection (WLLD) process. See FIG. 17B. Step 1504 includes disabling further programming of the one or more faulty blocks. Step 1505 includes continuing programming of the respective sets of memory cells of the one or more non-faulty blocks.

FIG. 15B depicts a flowchart of a program operation consistent with FIG. 15A, where a trigger (WLLD_trigger) for performing the word line leakage detection operation is predetermined. Step 1510 begins a program operation in multi-plane mode. Step 1511 sets NPL=1. Step 1512 applies a program pulse and performs a verify test for unpassed planes. A decision step 1513 determines whether all planes/blocks have passed verify. If the decision step 1513 is true, the program operation is done at step 1521. If the decision step 1513 is false, step 1514 includes marking any planes/blocks that pass verify as passed.

A decision step 1515 determines whether NPL=WLLD_trigger, a trigger number of program loops for initiating a word line leakage detection operation. If the decision step 1515 is false, a decision step 1516 determines whether NPL=NPL_max. If the decision step 1516 is true, step 1516a indicates that programming of the plane/block has failed, and the block is disabled. If the decision step 1516 is false, NPL is incremented by one at step 1520 and step 1512 is repeated in a next program loop. If the decision step 1515 is true, step 1517 performs a WLLD process for unpassed planes to identify faulty and non-faulty blocks. See FIG. 17B for further details. Step 1518 disables any faulty blocks which were identified at step 1517. Step 1519 includes continuing programming of any non-faulty blocks, including using a multi-plane mode for multiple non-faulty blocks. A single plane programming mode is used if there is just one non-faulty unpassed block remaining. Step 1520 follows step 1519.

In an example implementation, WLLD_trigger=2 and NPL_max=3.

In one approach, the WLLD process determines that there are a plurality of non-faulty blocks in which case the continuing of the programming of the respective sets of memory cells comprises continuing programming of the plurality of the respective sets of memory cells of the non-faulty blocks in the multi-plane mode.

In another approach, the WLLD process determines that there is a single non-faulty block in which case the continuing of the programming of the respective sets of memory cells of the one or more non-faulty blocks comprises continuing programming of the respective sets of memory cells of the single non-faulty block in a single-plane mode.

Figure 16A:
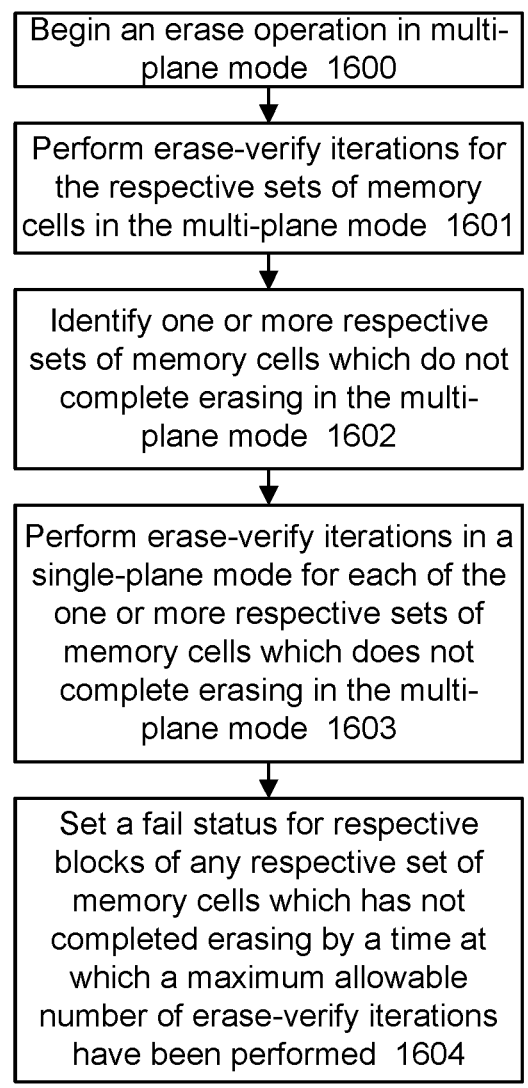
FIG. 16A depicts a flowchart of a process for identifying a faulty block of memory cells by switching from a multi-plane operation to a single-plane operation during erasing.

FIG. 16A depicts a flowchart of a process for identifying a faulty block of memory cells by switching from a multi-plane operation to a single-plane operation during erasing. Step 1600 begins an erase operation in a multi-plane mode. Step 1601 includes performing erase-verify iterations for the respective sets of memory cells in the multi-plane mode. This can be achieved, e.g., by setting the word line voltages to a low value which enables erasing while charging up the channels of the NAND strings in the selected blocks in their respective planes. Thus, the selected blocks are concurrently biased for erase. Step 1602 includes identifying one or more respective sets of memory cells which do not complete erasing in the multi-plane mode. Step 1603 includes performing erase-verify iterations in a single-plane mode for each of the one or more respective sets of memory cells which does not complete erasing in the multi-plane mode. This can be achieved, e.g., by setting the word line voltages to a low value which enables erasing while charging up the channels of the NAND strings in the unpassed blocks in their respective planes, one block at a time. Step 1604 includes setting a fail status for respective blocks of any respective set of memory cells which has not completed erasing by a time at which a maximum allowable number of erase-verify iterations have been performed.

Figure 16B:
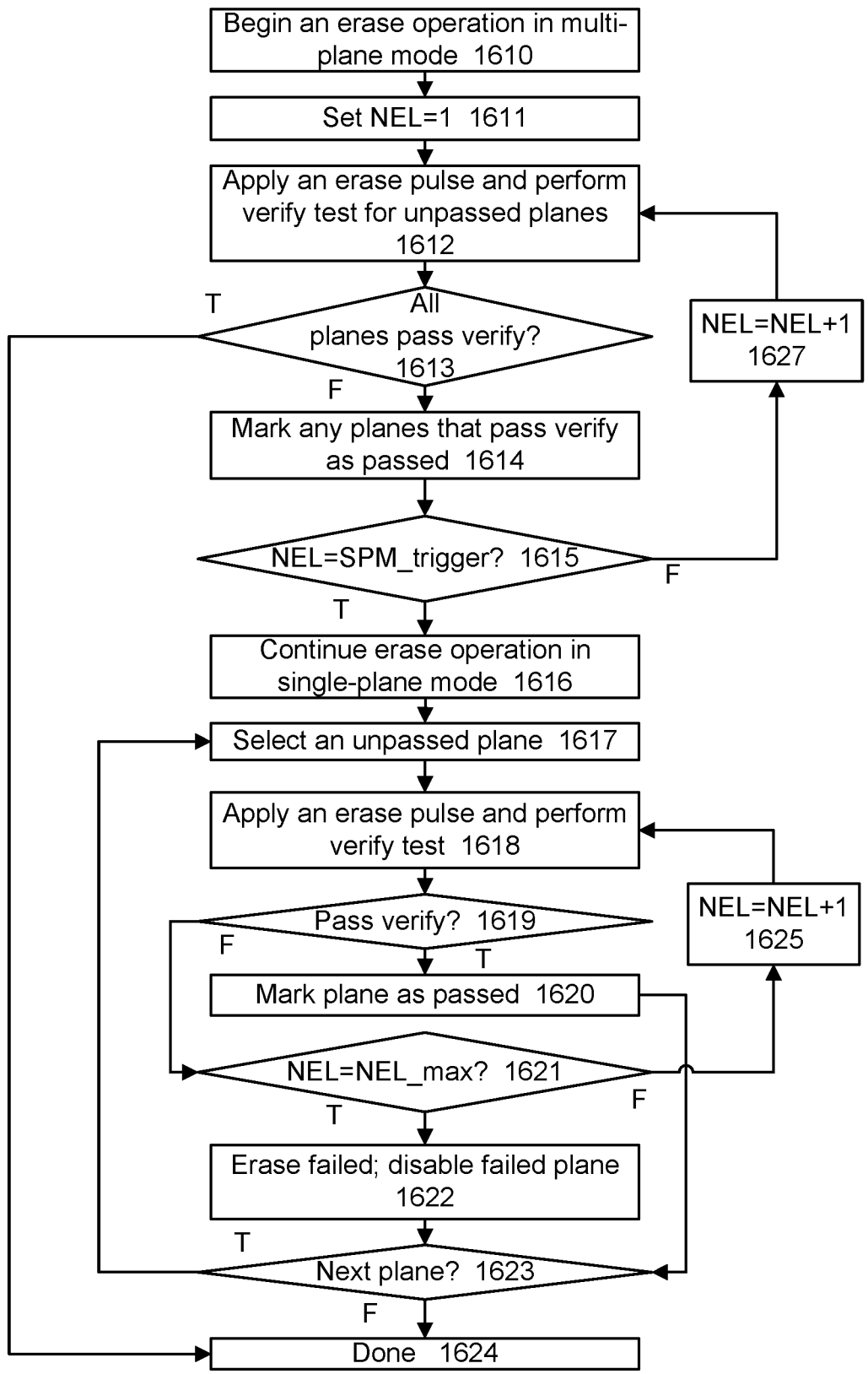
FIG. 16B depicts a flowchart of an erase operation consistent with FIG. 16A, where a trigger (SPM_trigger) for switching from a multi-plane operation to a single-plane operation, and a maximum allowable number of program loops (NPL_max) are predetermined.

FIG. 16B depicts a flowchart of an erase operation consistent with FIG. 16A, where a trigger (SPM_trigger) for switching from a multi-plane operation to a single-plane operation, and a maximum allowable number of program loops (NPL_max) are predetermined. Step 1610 begins an erase operation in multi-plane mode. Step 1611 sets the number of erase loops, NEL=1. Step 1612 applies an erase pulse and performs a verify test for unpassed planes, e.g., blocks/planes which have not yet completed erasing. As discussed, the erase pulse can be applied to the p-well for substrate charging of the channel, or to the SGD and/or SGS transistors via the bit line and/or source line, respectively, for charging the channels by GIDL. A decision step 1613 determines whether all planes/blocks have passed verify. If the decision step 1613 is true, the erase operation is done at step 1624. If the decision step 1613 is false, step 1614 includes marking any planes/blocks that pass verify as passed.

A decision step 1615 determines whether NEL=SPM_trigger, a trigger number of erase loops for initiating single-plane mode erasing. If the decision step is false, NEL is incremented by one at step 1627 and step 1612 is repeated in a next erase loop. If the decision step 1615 is true, step 1616 continues the erase operation in a single-plane mode. In this case, step 1617 selects an unpassed plane/block. Step 1618 applies an erase pulse and performs a verify test for the selected plane/block. A decision step 1619 determines whether the plane/block passes the verify test. If the decision step 1619 is true, step 1620 marks the plane/block as passed and a decision step 1623 determines whether there is a next plane to erase in the single-plane mode. If the decision step 1623 is false, the erase operation is done at step 1624. If the decision step 1623 is true, step 1617 is reached to select a next plane/block to erase in the single-plane mode. In the single-plane mode, a separate NEL is maintained for each block/plane so that NEL=SPM_trigger when the next block/plane is selected at step 1617.

If the decision step 1619 is false, a decision step 1621 determines whether NEL=NEL_max, the maximum allowable number of erase loops. If the decision step 1621 is false, NEL is incremented at step 1625 and step 1618 is reached again for a next erase loop. If the decision step 1621 is true, step 1622 indicates that erasing of the plane/block has failed, and the block is disabled.

In an example implementation, SPM_trigger=2 erase loops and NEL_max=3 erase loops. In this case, the single-plane erasing is allowed to perform just one erase loop for each unpassed plane/block.

The trigger number and/or maximum allowable number for the erase operation can also be adjusted based on an erase loop at which a block first passes verify, similar to the above discussion in connection with programming.

FIG. 16C depicts a flowchart of an erase operation, where a trigger (WLLD_trigger) for performing a block leakage detection operation is predetermined. Step 1630 begins an erase operation in multi-plane mode. Step 1631 sets NEL=1. Step 1632 applies an erase pulse and performs a verify test for unpassed planes. A decision step 1633 determines whether all planes/blocks have passed verify. If the decision step 1633 is true, the erase operation is done at step 1641. If the decision step 1633 is false, step 1634 includes marking any planes/blocks that pass verify as passed.

A decision step 1635 determines whether NEL=WLLD_trigger, a trigger number of erase loops for initiating a word line leakage detection operation. If the decision step 1635 is false, a decision step 1636 determines whether NEL=NEL_max. If the decision step 1636 is true, step 1636a indicates that erasing of the plane/block has failed, and the block is disabled. If the decision step 1636 is false, NEL is incremented by one at step 1640 and step 1632 is repeated in a next erase loop. If the decision step 1635 is true, step 1637 performs a WLLD process for unpassed planes to identify faulty and non-faulty blocks. See FIG. 17B for further details. Step 1638 disables any faulty blocks which were identified at step 1637. Step 1639 includes continuing erasing of any non-faulty blocks, including using a multi-plane mode for multiple non-faulty blocks. A single plane erasing mode is used if there is just one non-faulty unpassed block remaining. Step 1640 follows step 1639.

In an example implementation, WLLD_trigger=2 and NEL_max=3.

Figure 17A:
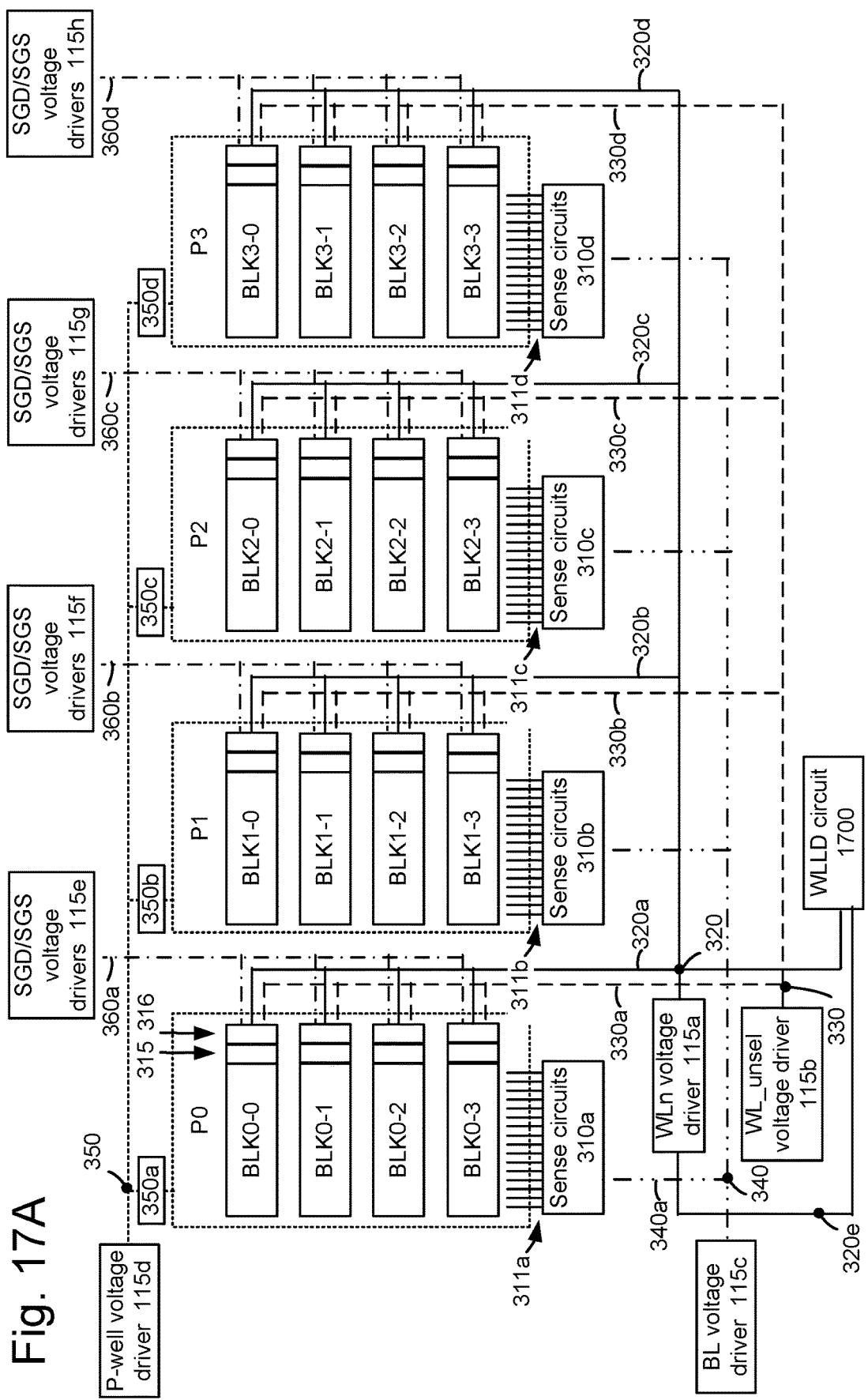
FIG. 17A is a block diagram depicting blocks of memory cells arranged in four example planes on a substrate, where circuitry for performing a word line leakage detection operation is provided, consistent with FIGS. 15A and 15B.

FIG. 17A is a block diagram depicting blocks of memory cells arranged in four example planes on a substrate, where a word line leakage detection (WLLD) circuit 1700 is provided, consistent with FIGS. 15A and 15B. The diagram is similar to FIG. 3A buts adds the WLLD circuit 1700. The WLLD circuit 1700 receives a first input from the WLn voltage driver at the node 320 and a second input from the WLn voltage driver at the node 320e. The voltage at the node 320 can be altered from the intended value by a short circuit of a word line. The WLLD circuit detects a difference between the voltages at the nodes 320 and 320e and sets a flag if the difference exceeds a reference level, Vref. See FIG. 17B for an example implementation of the WLLD circuit. In this example, the leakage detection process can occur for one block/plane at a time. Another option is to provide a separate WLLD circuit for each plane, in which case the leakage detection process can occur for multiple blocks/planes concurrently.

Figure 17B:
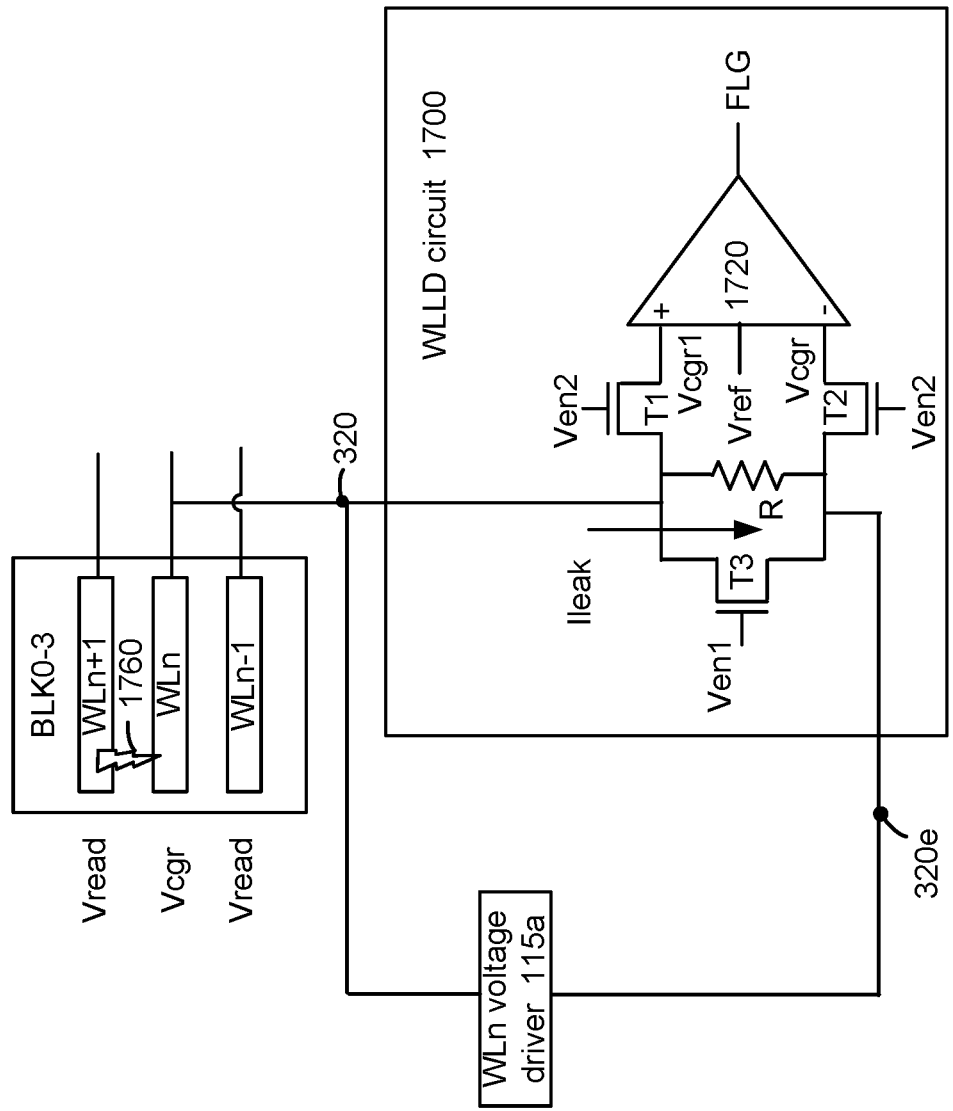
FIG. 17B is a block diagram of an example of the WLDD circuit 1700 of FIG. 17A.

FIG. 17B is a block diagram of an example of the WLLD circuit 1700 of FIG. 17A. The selected block is BLK0-3 in this example and includes word lines WLn−1, WLn and WLn+1. The WLn voltage driver 115a provides a voltage Vcgr on the node 320 and a node 320e. Vcgr is a relatively low control gate read voltage such as 0.5 V which is applied to WLn, while a relatively high voltage Vread, e.g., 9 V, is applied to the unselected word lines. If a short circuit 1760 is present between WLn and WLn+1, for example, Vcgr will be pulled up such that the voltage at the node 320 is higher than at the node 320e.

The nodes 320 and 320e are first and second inputs, respectively, to the WLLD circuit 1700. The node 320 is connected to a path between transistors T1 and T3, while the node 320e is connected to a path between transistors T2 and T3. T1 is connected to a non-inverting input (+) of a comparator 1720, while T2 is connected to an inverting input (−) of the comparator. The comparator may comprise an operational amplifier. A reference voltage Vref is also input to the comparator. If a voltage Vcgr1 exceeds Vcgr by more than Vref, a flag (FLG) is set at the output of comparator to indicate the presence of a short circuit and therefore a defective block. FLG can be provided to a controller to update a record of bad blocks which are to be disabled from further operations. When Vcgr1>Vcgr, a leakage current Ileak flows in the circuit 1700 through a resistor R.

The transistors T1-T3 are provided in a conductive state when the WLLD circuit is in use and in a non-conductive state when the WLLD circuit is not in use. T2 is made conductive by a voltage Ven1 while T1 and T2 are made conductive by voltages Ven2.

Figure 18:
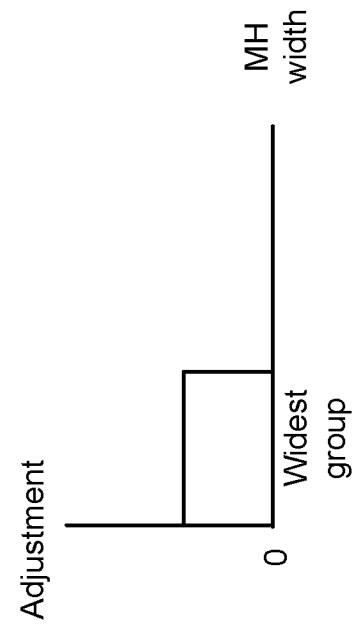
FIG. 18 is an example plot of an adjustment to SPM_trigger, WLLD_trigger, NPL_max or NEL_max as a function of temperature, consistent with FIG. 14A-16B.

FIG. 18 is an example plot of an adjustment to SPM_trigger, WLLD_trigger, NPL_max or NEL_max as a function of temperature, consistent with FIG. 14A-16B. As discussed, SPM_trigger is the PL count at which a single plane mode is triggered in a program or erase operation, WLLD_trigger is the PL count at which a leakage detection operation is triggered in a program or erase operation, NPL_max is the maximum allowable number of program loops and NEL_max is the maximum allowable number of erase loops.

When the ambient temperature Temp. is relatively low, e.g., below a threshold temperature Temp_th, the program and erase operations tend to need more loops to complete. In this case, an adjustment of one or more loops can be made, while no adjustment is made when Temp≥Temp_th.

In one approach, a control circuit is configured to set at least one of the trigger number of common program pulses and the maximum allowable number of program pulses as a decreasing function of a temperature, e.g., the number is higher when the temperature is lower.

FIG. 19 is an example plot of an adjustment to SPM_trigger, WLLD_trigger, NPL_max or NEL_max as a function of memory hole width, consistent with FIGS. 6C, 6D and 14A-16B. When the memory hole (MH) width is relatively large, e.g., in a widest group such as described in connection with FIGS. 6C and 6D, the program and erase operations tend to need more loops to complete. In this case, an adjustment of one or more loops can be made, while no adjustment is made when the memory hole (MH) width is moderate or relatively small.

In one approach, a control circuit is configured to set at least one of the trigger number of common program pulses and the maximum allowable number of program pulses based on memory hole widths corresponding to the respective word lines in respective blocks.

Figure 20:
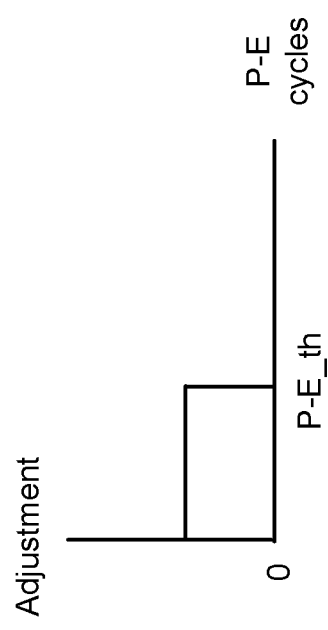
FIG. 20 is an example plot of an adjustment to SPM_trigger, WLLD_trigger, NPL_max or NEL_max as a function of a number of P-E cycles, consistent with FIGS. 12 and 14A-16B.

FIG. 20 is an example plot of an adjustment to SPM_trigger, WLLD_trigger, NPL_max or NEL_max as a function of a number of P-E cycles, consistent with FIGS. 12 and 14A-16B. When the number of P-E cycles is relatively low, e.g., below a threshold P-E_th, the program and erase operations tend to need more loops to complete. In this case, an adjustment of one or more loops can be made, while no adjustment is made when P-E≥P-E_th.

In one approach, a control circuit is configured to set at least one of the trigger number of common program pulses and the maximum allowable number of program pulses as a decreasing function of a number of program-erase cycles e.g., the number is higher when the number of P-E cycles is lower. For erase, the control circuit is configured to set at least one of the trigger number of common erase pulses and the maximum allowable number of erase pulses as an increasing function of a number of program-erase cycles e.g., the number is lower when the number of P-E cycles is higher.

FIG. 21 depicts an example of a temperature-sensing circuit 2100 for use in connection with FIG. 18. The circuit can be part of the control circuitry 110 of FIG. 1A, for example. The circuit includes pMOSFETs 2110a, 2110b and 2112, bipolar transistors 2111a and 2111b and resistors R1, R2 and R3. I1, I2 and I3 denote currents. Voutput is a temperature-based output voltage provided to an analog-to-digital (ADC) converter 2125. Vbg is a temperature-independent voltage. A voltage level generation circuit 2120 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 2130 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 2110b and the voltage drop across the resistor R2. The bipolar transistor 2111a has a larger area (by a factor N) than the transistor 2111b. The PMOS transistors 2110a and 2110b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 2112 is connected to a supply voltage Vdd and the node between the transistor's drain and the resistor R3 is the output voltage, Voutput. The gate of the transistor 2112 is connected to the same terminal as the gates of transistors 2110a and 2110b and the current through the transistor 2112 mirrors the current through the transistors 2110a and 2110b.

Accordingly, in one implementation, an apparatus comprises: a control circuit configured to connect to a word line in each plane of a plurality of planes, each word line is connected to a respective set of memory cells. The control circuit, to perform a program operation for the respective sets of memory cells, is configured to: apply one or more common program pulses to each word line in a multi-plane program mode; determine that one or more respective sets of memory cells have not completed programming when a trigger number of common program pulses have been applied; and in response to the determining that the one or more respective sets of memory cells have not completed programming when the trigger number of common program pulses have been applied, apply program pulses to word lines of the one or more respective sets of memory cells which have not completed programming in a single-plane program mode, one respective set of memory cells at a time, until no more than a maximum allowable number of program pulses have been applied.

In another implementation, a method comprises: programming a plurality of respective sets of memory cells in a corresponding plurality of respective blocks, the plurality of respective blocks are in a corresponding plurality of respective planes on a substrate, and the plurality of respective sets of memory cells are programmed with a trigger number of program-verify iterations in a multi-plane mode; identifying respective sets of memory cells among the plurality of respective sets of memory cells which do not complete programming in the trigger number of program-verify iterations; identify one or more faulty blocks and one or more non-faulty blocks among blocks comprising the respective sets of memory cells which do not complete programming in the trigger number of program-verify iterations; disabling further programming of the one or more faulty blocks; and continuing programming of the respective sets of memory cells of the one or more non-faulty blocks.

In another implementation, an apparatus comprises: a control circuit configured to connect to a plurality of respective sets of memory cells in respective planes on a substrate; and an interface connected to the control circuit. The control circuit is configured to issue a command via the interface to: perform erase-verify iterations for the respective sets of memory cells in a multi-plane mode; identify one or more respective sets of memory cells which do not complete erasing in the multi-plane mode; and perform erase-verify iterations in a single-plane mode for each of the one or more respective sets of memory cells which does not complete erasing in the multi-plane mode.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a word line in each plane of a plurality of planes, each word line is connected to a respective set of memory cells, to perform a program operation for the respective sets of memory cells, the control circuit is configured to:
apply one or more common program pulses to each word line in a multi-plane program mode;
determine that at least a first set of memory cells has completed programming when a first number of common program pulses have been applied;
in response to determining that at least the first set of memory cells has completed programming, set a trigger number according to the first number;
determine that one or more respective sets of memory cells have not completed programming when the trigger number of common program pulses have been applied; and
in response to the determining that the one or more respective sets of memory cells have not completed programming when the trigger number of common program pulses have been applied, apply program pulses to word lines of the one or more respective sets of memory cells which have not completed programming in a single-plane program mode, one respective set of memory cells at a time, until no more than a maximum allowable number of program pulses have been applied.

2. The apparatus of claim 1, wherein the respective sets of memory cells are in respective blocks, and control circuit is configured to:
set a fail status for, and disabling for use in future operations, respective blocks of any respective set of memory cells which has not completed programming when the maximum allowable number of program pulses have been applied; and
set a pass status for respective blocks of any respective set of memory cells which has completed programming no later than when the maximum allowable number of program pulses have been applied.

3. The apparatus of claim 1, wherein:
the common program pulses in the multi-plane mode and the program pulses in the single-plane mode are applied by a single voltage driver.

4. The apparatus of claim 1, wherein:
the programming of the respective sets of memory cells comprises single bit per cell programming.

5. The apparatus of claim 1, wherein:
the control circuit is configured to set the trigger number to the sum of the first number and a predetermined number.

6. The apparatus of claim 1, wherein:
the maximum allowable number is an increasing function of a program loop at which a set of memory cells of the respective sets of memory cells first completes programming.

7. The apparatus of claim 1, wherein:
the control circuit is configured to set the maximum allowable number based on memory hole widths corresponding to the respective word lines.

8. A method of performing a program operation, comprising:
applying one or more common program pulses to a word line of each plane in a multi-plane program mode of a multi-plane in which each word line is connected to a respective set of memory cells;
determining that at least a first set of memory cells has completed programming when a first number of common program pulses have been applied;
in response to determining that at least the first set of memory cells has completed programming, setting a trigger number according to the first number;
determining that one or more respective sets of memory cells have not completed programming when the trigger number of common program pulses have been applied; and
in response to the determining that the one or more respective sets of memory cells have not completed programming when the trigger number of common program pulses have been applied, applying program pulses to word lines of the one or more respective sets of memory cells which have not completed programming in a single-plane program mode, one respective set of memory cells at a time, until no more than a maximum allowable number of program pulses have been applied.

9. The method of claim 8, further comprising:
setting a fail status for, and disabling for use in future operations, respective blocks of any respective set of memory cells which has not completed programming when the maximum allowable number of program pulses have been applied; and
setting a pass status for respective blocks of any respective set of memory cells which has completed programming no later than when the maximum allowable number of program pulses have been applied.

10. The method of claim 8, further comprising:
applying the common program pulses in the multi-plane mode and applying the program pulses in the single-plane mode using single voltage driver.

11. The method of claim 8, wherein the programming of the respective sets of memory cells comprises single bit per cell programming.

12. The method of claim 8, further comprising:
setting the trigger number to a sum of the first number and a predetermined number.

13. The method of claim 1, further comprising:
increasing the maximum allowable number as a function of a program loop at which a set of memory cells of the respective sets of memory cells first completes programming.

14. An apparatus, comprising:
a control circuit configured to connect to a word line in each plane of a plurality of planes, each word line is connected to a respective set of memory cells formed in memory holes that vary in width, to perform a program operation for the respective sets of memory cells, the control circuit is configured to:
apply one or more common program pulses to each word line in a multi-plane program mode;
determine that one or more respective sets of memory cells have not completed programming when a trigger number of common program pulses have been applied; and
in response to the determining that the one or more respective sets of memory cells have not completed programming when the trigger number of common program pulses have been applied, apply program pulses to word lines of the one or more respective sets of memory cells which have not completed programming in a single-plane program mode, one respective set of memory cells at a time, until no more than a maximum allowable number of program pulses have been applied, at least one of the trigger number and the maximum allowable number based on the memory hole widths corresponding to the respective word lines.

15. The apparatus of claim 14, wherein the respective sets of memory cells are in respective blocks, and control circuit is configured to:
set a fail status for, and disabling for use in future operations, respective blocks of any respective set of memory cells which has not completed programming when the maximum allowable number of program pulses have been applied; and
set a pass status for respective blocks of any respective set of memory cells which has completed programming no later than when the maximum allowable number of program pulses have been applied.

16. The apparatus of claim 14, wherein:
the common program pulses in the multi-plane mode and the program pulses in the single-plane mode are applied by a single voltage driver.

17. The apparatus of claim 14, wherein:
the programming of the respective sets of memory cells comprises single bit per cell programming.

18. The apparatus of claim 14, wherein:
the maximum allowable number is an increasing function of a program loop at which a set of memory cells of the respective sets of memory cells first completes programming.

19. The apparatus of claim 14, wherein:
the control circuit is configured to set the trigger number to the sum of the first number and a predetermined number and set the maximum allowable number based on the memory hole widths corresponding to the respective word lines.

* * * * *